United States Patent
Takaki et al.

Patent Number: 6,065,425
Date of Patent: May 23, 2000

[54] PLASMA PROCESS APPARATUS AND PLASMA PROCESS METHOD

[75] Inventors: Satoshi Takaki, Komae; Atsushi Yamagami, Kawasaki, both of Japan

[73] Assignee: Canon Kabushiki Kaisha, Tokyo, Japan

[21] Appl. No.: 09/120,319

[22] Filed: Jul. 22, 1998

Related U.S. Application Data

[63] Continuation of application No. 08/822,711, Mar. 21, 1997, abandoned.

[30] Foreign Application Priority Data

Jul. 23, 1997 [JP] Japan ......... 9-197256

[51] Int. Cl.$^7$ ......... C23C 16/00
[52] U.S. Cl. ......... 118/723 E; 118/718; 156/345
[58] Field of Search ......... 118/723 E, 723 R, 118/718; 156/345

[56] References Cited

U.S. PATENT DOCUMENTS

| | | | |
|---|---|---|---|
| 5,540,781 | 7/1996 | Yamagami et al. | 118/723 |
| 5,846,612 | 12/1998 | Takaki et al. | 427/569 |
| 5,861,063 | 1/1999 | Shou | 118/723 E |

FOREIGN PATENT DOCUMENTS 0154160  9/1995  European Pat. Off.

63-235478  9/1988  Japan.

OTHER PUBLICATIONS

H. Curtins, et al., "Influence of Plasma Excitation Frequency for a–Si: H Thin Film Deposition", Plasma Chemistry and Plasma Processing, vol. 7, No. 3, 1987, pp. 267–273.

Primary Examiner—Thi Dang
Attorney, Agent, or Firm—Fitzpatrick, Cella, Harper & Scinto

[57] ABSTRACT

In order to effect a plasma process at a high rate, such as formation of a high-quality deposit film having very uniform thickness and quality over a large-area substrate, (1) an oscillation frequency of an RF generator is used in the range of 30 to 600 MHz, (2) a matching circuit and a cathode electrode are connected through a transmission line and RF power is supplied through the transmission line, (3) the cathode electrode is of an electrically conductive structure of a rod shape and at a connection part between the cathode electrode and an inner conductor of the transmission line, an external shape of a cross section of the cathode electrode is the same as an external shape of a cross section of the inner conductor, and (4) at least the connection part between the cathode electrode and the inner conductor of the transmission line is covered by a dielectric member having the same external shape as an external shape of a transmission medium in the cross section of the transmission line.

36 Claims, 9 Drawing Sheets

PLASMA PROCESS APPARATUS AND PLASMA PROCESS METHOD

This application is a continuation-in-part of application Ser. No. 08/822,711 filed Mar. 21, 1997 now abandoned.

BACKGROUND OF THE INVENTION

1. Field of the Invention

The present invention relates to a plasma process apparatus and a plasma process method. More particularly, the invention relates to a plasma process apparatus typified by a plasma enhanced CVD system used in fabrication of semiconductor devices, photosensitive devices for electrophotography, line sensors for input of image, flat panel displays, imaging devices, photovoltaic devices, and so on, and to a plasma process method typified by a deposit film forming process, and etching and ashing processes by plasma CVD.

2. Related Background Art

In recent years, the plasma enhanced CVD systems are industrially employed practically in the fabrication processes of semiconductor devices or the like.

Particularly, the plasma enhanced CVD systems using the high frequency radio frequency wave of 13.56 MHz or the microwave of 2.45 GHz are widely used, because they can process materials for substrates, materials for deposited films, etc., regardless of whether conductor or insulator.

A parallel plate type apparatus using high frequency energy will be described as an example of the plasma enhanced CVD system, referring to FIG. 1. A cathode electrode (703) is placed through an insulating cathode electrode support (702) in a reaction vessel (701). A ground shield (704) is positioned around the cathode electrode (703) so as to prevent discharge from occurring between the side of cathode electrode (703) and the reaction vessel (701). A high frequency power supply or RF generator (711) is connected through matching circuit (709) and RF power supply line (710) to the cathode electrode (703). A film-deposited substrate of flat plate (706) subjected to plasma CVD is placed on an opposed electrode (705) disposed in parallel with the cathode electrode (703) and this film-deposited substrate (706) is kept at a desired temperature by a substrate temperature controller (not shown).

The plasma CVD is carried out as follows using the above apparatus. The reaction vessel (701) is evacuated to a high vacuum by a vacuum evacuator (707) and thereafter reaction gas is introduced into the reaction vessel (701) from a gas supply source (708) to maintain the inside of reaction vessel under predetermined pressure. Then RF power is supplied from the RF generator (711) to the cathode electrode (703) to generate a plasma between the cathode electrode and the opposed electrode. This causes the plasma to decompose and excite the reaction gas, whereby a deposited film is formed on the film-deposited substrate (706).

The RF energy of 13.56 MHz is normally used as RF energy. The plasma CVD process with the discharge frequency of 13.56 MHz has such advantages that control of discharge conditions is relatively easy and that quality of the film obtained is excellent. However, it has problems of low utilization factor of gas and relatively low rate of formation of deposited film.

Taking such problems into consideration, investigation has been made on the plasma CVD process using high frequency (RF) waves in the frequency range of approximately 25 to 150 MHz. For example, Plasma Chemistry and Plasma Processing, Vol. 7, No. 3 (1987) p 267–273 describes the process for forming an amorphous silicon (also referred to as "a-Si") film by decomposing raw-material gas (silane gas) by RF energy of frequency of 25 to 150 MHz, using a parallel plate type glow discharge decomposing apparatus. Specifically, it describes that the amorphous silicon films are formed with changing the frequency in the range of 25 to 150 MHz, that the film deposition rate is highest, 2.1 nm/sec, at 70 MHz, which forming rate is approximately 5 to 8 times greater than in the case of the above plasma CVD process using 13.56 MHz, and that defect density, band gap, and electrical conductivity of the amorphous silicon films obtained are rarely affected by excitation frequency. However, film formation described in this reference was carried out in laboratory scale, and it describes nothing about whether such effects can be expected in formation of films in a large area. Further, this reference suggests nothing about efficient formation of large-area semiconductor device for practical use by carrying out film formation simultaneously on a plurality of substrates. This reference simply suggests the possibility that use of RF (13.56 to 200 MHz) will open interesting vistas of high-speed processing of low-cost and large-area a-Si:H thin film devices required to have the thickness of several $\mu$m.

The above conventional example is an example of the plasma CVD apparatus suitable for processing the flat plate substrate, while EP-A-154160 describes an example of the plasma CVD apparatus suitable for forming a deposited film on a plurality of cylindrical substrates. This reference discloses the plasma CVD apparatus using the microwave energy source of frequency 2.45 GHz and the plasma CVD apparatus using a radio frequency energy (RF energy) source. In the plasma CVD apparatus using the microwave energy source, the plasma density is extremely high upon film formation because of the use of microwave energy, and therefore, the raw-material gas is decomposed quickly to achieve high-speed deposition of film. This results in a problem that it is difficult in the case of this apparatus to stably form a finer deposited film.

An example of the plasma CVD apparatus (RF plasma CVD apparatus) using the RF energy source, of the type described in EP-A-154160, will be described with reference to FIG. 2 and FIG. 3. FIG. 2 and FIG. 3 illustrate a plasma CVD apparatus based on the RF plasma CVD apparatus described in Reference 2. FIG. 3 is a cross-sectional view taken along line 3—3 of FIG. 2. In FIG. 2 and FIG. 3, reference numeral 100 designates a reaction vessel. In the reaction vessel (100), there are six substrate holders (105A) disposed concentrically at predetermined intervals. Numeral 106 denotes cylindrical substrates for film formation disposed on the respective substrate holders (105A). A heater (140) is provided inside each substrate holder (105A) and is arranged to heat the cylindrical substrate (106) from inside. Each substrate holder (105A) is arranged to rotate as being connected to a shaft (131) for rotation of the substrate connected to a motor (132). Numeral 105B denotes auxiliary holding members of cylindrical substrate (106). Numeral 133 represents seal members. Numeral 103 designates the cathode electrode for input of RF power located at the center of plasma generation region. This cathode electrode (103) is connected through a matching circuit (109) to an RF generator (111). Numeral 120 indicates a cathode electrode supporting member. Numeral 107 stands for an exhaust pipe provided with an exhaust valve, and this exhaust pipe (107) is in communication with an evacuation mechanism (135) provided with a vacuum pump. Numeral 108 designates a raw-material gas supply source constructed of a gas bomb, a mass flow controller, a valve, and so on. This raw-material gas supply source (108) is connected through gas supply pipe (117) to gas discharge pipes (116) provided with a plurality of gas discharge holes.

The plasma CVD is carried out as follows using the above apparatus. The reaction vessel (100) is evacuated to a high vacuum by the evacuation mechanism (135) and thereafter the raw-material gas is introduced from the raw-material gas supply source (108) through the gas supply pipe (117) and gas discharge pipes (116) into the reaction vessel (100) to maintain the inside of the vessel under predetermined pressure. After being thus set, the RF power is supplied from the RF power supply (111) through the matching circuit (109) to the cathode electrode (103) to generate the plasma between the cathode electrode and the cylindrical substrates (106). This causes the plasma to decompose and excite the raw-material gas, whereby a deposited film is formed on the cylindrical substrates (106).

Use of the plasma CVD apparatus illustrated in FIG. 2 and FIG. 3 enjoys an advantage that the raw material gas can be used at a high utilization factor, because the discharge space is surrounded by the cylindrical substrates (106).

It is, however, necessary to rotate the cylindrical substrates in order to form the deposited film over the entire surface of cylindrical substrate and the rotation will decrease the substantial deposition rate to about one third to one fifth of that in the case of use of the parallel plate type plasma CVD apparatus described above. The reason is as follows. Since the discharge space is surrounded by the cylindrical substrates, the deposited film is formed at a deposition rate equivalent to that of the parallel plate type plasma CVD apparatus at the position where each cylindrical substrate is opposed to the cathode electrode, whereas little deposited film is formed at positions where the substrate is not in contact with the discharge space. EP-A-154160 describes nothing about specific frequencies of the RF energy. When the amorphous silicon film was actually deposited over the entire circumferential surface of substrate with rotating the cylindrical substrates, using the plasma CVD apparatus shown in FIG. 2 and FIG. 3, using ordinary 13.56 MHz as the RF energy, and using $SiH_4$ as the raw-material gas, under the pressure condition of several 100 mTorr it was easy to achieve a high deposition rate but to generate powder of polysilane or the like, the substantial deposition rate was at most 0.5 nm/s. In fabricating an electrophotographic photosensitive member having the photosensitive layer of the amorphous silicon film using the plasma CVD apparatus shown in FIG. 2 and FIG. 3, supposing the necessary film thickness of the amorphous silicon photosensitive layer is approximately 30 $\mu$m, 16 or more hours will be necessary for deposition of film if the above deposition rate of about 0.5 nm/sec is applied. This is not always satisfactory in productivity. Also, the plasma CVD apparatus shown in FIG. 2 and FIG. 3 tends to form a nonuniform plasma in the axial direction of cylindrical substrate when the frequency of RF energy is 30 or more MHz, and thus has a problem that it is extremely difficult to form a homogeneous deposited film on the cylindrical substrate.

SUMMARY OF THE INVENTION

An object of the present invention is thus to provide a plasma process apparatus and a plasma process method, solving the above problems in the conventional technology, that can fabricate semiconductor devices at high efficiency as forming a high-quality deposited film with extremely uniform thickness and quality on a large-area substrate at a high rate or that can perform etching or ashing uniformly and quickly.

A further object of the present invention is to provide a plasma process apparatus and a plasma process method that can fabricate semiconductor devices at high efficiency as forming a high-quality deposited film, for example, on surfaces of plural cylindrical substrates at high rate, for example, with extremely uniform thickness and quality in all directions including the axial direction and the circumferential direction of the cylindrical substrates.

Still another object of the present invention is to provide a plasma process apparatus having a reaction vessel with a space a pressure of which can be reduced, and a cathode electrode disposed in the reaction vessel and connected through a transmission line to a high-frequency power supply an oscillation frequency of which comprises at least the range of 30 MHz to 600 MHz, wherein the cathode electrode has an electrically conductive material and a shape of a cross-section of a connected portion of the electrically conductive member with the transmission line is the same or substantially the same as a shape of a cross-section in the connected portion of an internal conductor of the transmission line.

A further object of the present invention is to provide a plasma process apparatus having a reaction vessel with a space a pressure of which can be reduced, substrate holding means and a cathode electrode disposed in the reaction vessel, and a transmission line for supplying high-frequency power generated by a high-frequency power supply through a matching circuit to the cathode electrode, the plasma process apparatus generating a plasma between the cathode electrode and a substrate held by the substrate holding means to effect a plasma process on the substrate, 1) wherein an oscillation frequency of a wave oscillated from the high-frequency power supply comprises at least the range of 30 MHz to 600 MHz, 2) wherein the matching circuit and the cathode electrode are connected through the transmission line and the high-frequency power is transmitted through the transmission line, 3) wherein the cathode electrode has a rodlike, electrically conductive structure and in a connection part between the cathode electrode and an internal conductor of the transmission line an external shape of a cross-section of the cathode electrode is the same as an external shape of a cross-section of the internal conductor, and 4) wherein at least the connection part between the cathode electrode and the internal conductor of the transmission line is covered by a dielectric member having the same external shape as an external shape of a transmission medium in the cross-section of the transmission line.

Another object of the present invention is to provide a plasma process apparatus attained by arranging the above plasma process apparatus in such a way that the substrate is a cylindrical substrate, the aforementioned substrate holding means is arranged so that a plurality of such cylindrical substrates are positioned around the cathode electrode disposed in the reaction vessel with center axes of the cylindrical substrates being positioned on a substantially same circumference, and the plasma is generated between the plurality of cylindrical substrates and the cathode electrode to effect the plasma process on surfaces of the cylindrical substrates.

An additional object of the present invention is to provide a plasma process apparatus constructed so that the substrate is a cylindrical substrate, the aforementioned substrate holding means is positioned so that a plurality of cathode electrodes are arranged around the cylindrical substrate, and the plasma is generated between these cathode electrodes and cylindrical substrate to effect the plasma process on a surface of the cylindrical substrate.

A further object of the present invention is to provide a plasma process apparatus constructed so that the plasma process can be effected on the surface of the substrate with rotating the substrate.

An object of the present invention is to provide a plasma process apparatus constructed so that the substrate is a flat plate substrate, a single cathode electrode or a plurality of cathode electrodes are arranged in parallel with the flat plate substrate, and the plasma is generated between the cathode electrode and the flat plate substrate to effect the plasma process on a surface of the flat plate substrate.

A further object of the present invention is to provide a plasma process apparatus constructed so that the substrate is a sheet substrate fed out of a holding roll and wound up by a winding roll upon formation of film, a single cathode electrode or a plurality of cathode electrodes are arranged in parallel with the sheet substrate, and the plasma is generated between the cathode electrode and the sheet substrate to effect the plasma process on a surface of the sheet substrate.

Another object of the present invention is to provide a plasma process method using the above plasma process apparatus.

A further object of the present invention is to provide a plasma process apparatus and a plasma process method that are optimal for performing formation of deposit film, etching, or ashing as the plasma process.

A still further object of the present invention is to provide a plasma process apparatus having a reaction vessel with a space a pressure of which can be reduced, substrate holding means and a cathode electrode disposed in the reaction vessel, and a transmission line for supplying high-frequency power generated by a high-frequency power supply through a matching circuit to the cathode electrode, the plasma process apparatus generating a plasma between the cathode electrode and a substrate held by the substrate holding means to effect a plasma process on the substrate, 1) wherein an oscillation frequency of wave oscillated from the high-frequency power supply comprises at least the range of 30 MHz to 600 MHz, 2) wherein the matching circuit and the cathode electrode are connected to each other through the transmission line; the transmission line is a coaxial transmission line formed of a columnar or cylindrical inner conductor with an outer diameter A1, a cylindrical outer conductor with a bore diameter B1 and a cylindrical dielectric member with a dielectric constant ϵ1; and the high-frequency power is transmitted through the transmission line, 3) wherein the cathode electrode is a columnar or cylindrical, conductive structure with an outer diameter A2 and is covered with a cylindrical dielectric member with a dielectric constant ϵ2 and an outer diameter B2, and 4) wherein the dimensions and dielectric constants of the members which form the transmission line and the cathode electrode portion satisfy the relation expressed by Equation (1)

$$0.9 \times \sqrt{\frac{1}{\epsilon 1}} \times \ln\left(\frac{B1}{A1}\right) \leq \sqrt{\frac{1}{\epsilon 2}} \times \ln\left(\frac{B2}{A2}\right) \leq 1.1 \times \sqrt{\frac{1}{\epsilon 1}} \times \ln\left(\frac{B1}{A1}\right). \quad (1)$$

DETAILED DESCRIPTION OF THE PREFERRED EMBODIMENTS

Figure 1:
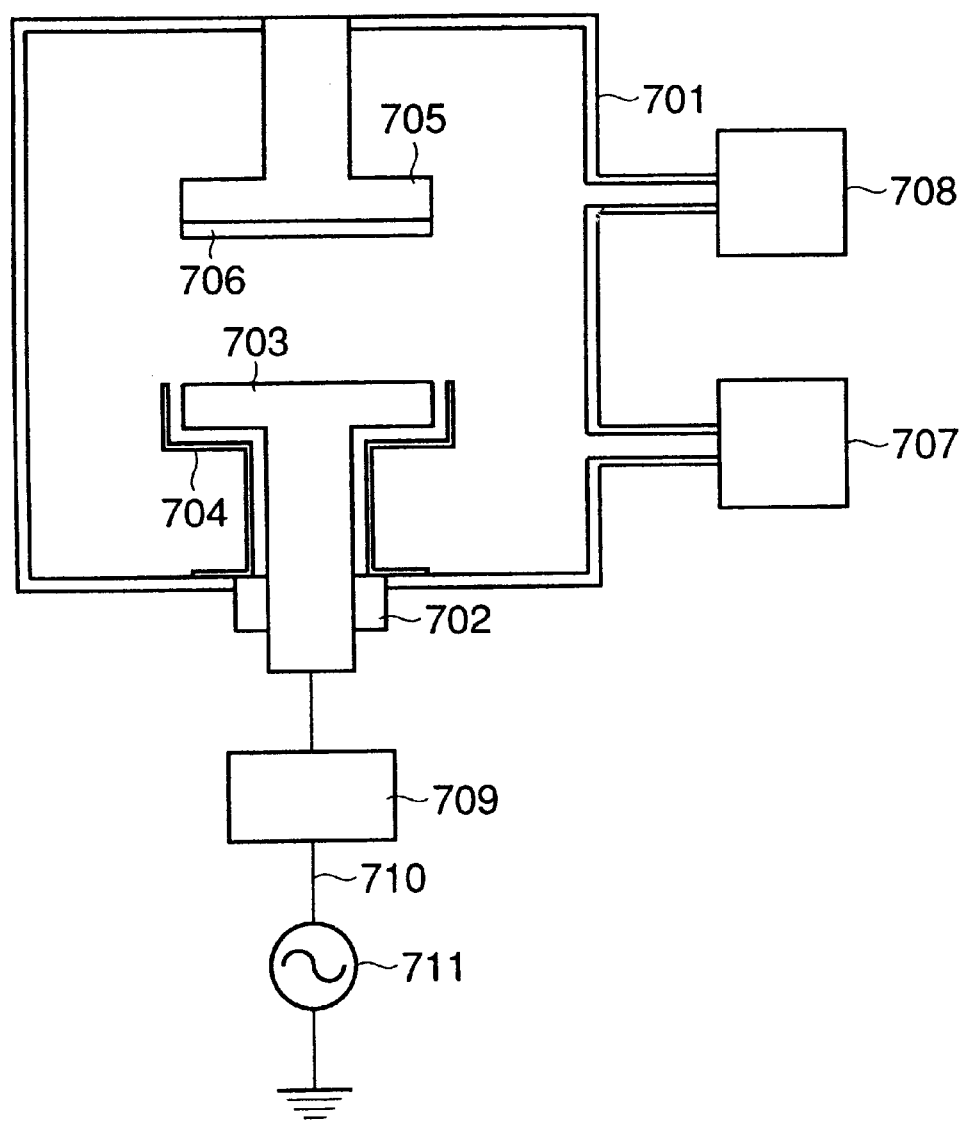
FIG. 1 is a schematic cross-sectional view to show an example of the plasma process apparatus.

The present invention will be described in detail.

The inventors conducted Comparative Example 1 described hereinafter and came to find that when the frequency of RF energy was set preferably at 30 MHz or more, more preferably at 60 MHz or more, discharge became possible in the high vacuum region where the vapor phase reaction was unlikely to take place, to obtain very excellent film properties, and the deposition rate was increased as compared with the case of 13.56 MHz, but film quality distribution and deposition rate distribution were degraded.

Thus, the present inventors made extensive and intensive investigations to clarify causes that degraded the quality of film unevenly when the frequency of RF energy was set at 30 MHz or more. As a result, the inventors found that there was a strong relation between the plasma potential distribution and the uneven degradation of film quality. Specifically, plasma potentials were measured along the axial direction of cylindrical substrate by the Langmuir probe method, which showed a drop of plasma potential at a portion corresponding to a position where the film quality was degraded unevenly.

We inferred from the above investigation result that the degradation of film quality distribution and deposition rate distribution was caused by an impedance gap at an inlet portion through which the RF power was guided to the cathode electrode, 1) which enhanced the electric field at the inlet portion to make the plasma unevenly distributed at the inlet portion, and 2) which impeded RF transmission to the cathode electrode, so as to make the RF power supplied to the other portions than the cathode electrode and to generate a standing wave in an ion sheath formed on the substrate or on surfaces of constituent members surrounding the discharge space.

In general, when the plasma is generated by applying the RF power between the cathode electrode and the opposed electrode, in order to transmit the RF power onto the cathode electrode and in order to prevent the plasma from being generated in the portion of the transmission line, the transmission line used is one comprised of an internal conductor connected to the cathode electrode, a dielectric member surrounding it, and an earth shield for surrounding the dielectric member to shut off radiation of the RF power to the outside. When the RF power is transmitted from this transmission line to the cathode electrode, an RF electromagnetic field transmitted between the internal conductor and the earth shield comes to face the plasma, which is an absorber of RF power, in front thereof at the entrance from the transmission line to the cathode electrode, where the plasma absorbs the RF power greatly and therefore, the plasma becomes unevenly distributed at the inlet portion to the cathode electrode.

Further, an unignorable standing wave sometimes occurs on the plasma generating space from the relationship between the frequency of RF power applied to the electrode and the size of the plasma generating space. Specifically, when the frequency of RF power is high or when the surface area of discharge space is large, the standing wave becomes easier to generate. If the standing wave is large, the electric field distribution will become worse in the discharge space, which will disturb the plasma distribution including the plasma density, plasma potential, electron temperature, etc., between the electrodes and which will negatively affect the quality of film formation of plasma CVD. The plasma can be considered as a conductor located in the space surrounded by the ion sheath and the RF electromagnetic field mainly propagates in the ion sheath. Then a reflected wave appears at the end of the discharge space and interferes with the incident wave, thereby generating the standing wave affecting the film quality and deposition rate at the frequencies of 30 MHz or more, presumably. Especially, the electric field becomes weak at the position of a node of a standing wave so as to cause the unevenly distributed decrease of plasma potential and to degrade the film quality unevenly, presumably. It is also supposed that nodes of a standing wave appeared at a plurality of positions at the frequencies of 400 to 600 MHz.

The present inventors investigated the configuration and structure of the inlet portion of RF power to the cathode electrode in order to prevent the degradation of film quality distribution and film thickness distribution easier to occur with increasing frequencies of RF energy. As a result, we found that in order to suppress the uneven distribution of plasma at the inlet portion of the RF power to the cathode electrode and to suppress generation of standing waves of RF electromagnetic field particularly on the substrate, it was effective to make the impedance of the RF transmission circuit equal to or almost equal to the impedance of the cathode electrode, so as to permit as much RF power to be transmitted only to the cathode electrode as possible. The plasma can be considered as a conductor surrounded by the ion sheath, as described above. Therefore, we found that the following two were effective in order to make the impedance between the cathode electrode and the plasma close to the impedance of the transmission line to the cathode electrode.

1) In the connection part between the cathode electrode and the inner conductor of the transmission line, the outer shape and size of the cross section of the cathode electrode is equalized to the external shape and size of the cross-section of the inner conductor.

2) At least the connection part between the cathode electrode and the inner conductor of the transmission line is covered by a dielectric member having the same external shape as an external shape of a transmission medium in the cross section of the transmission line.

Figure 4:
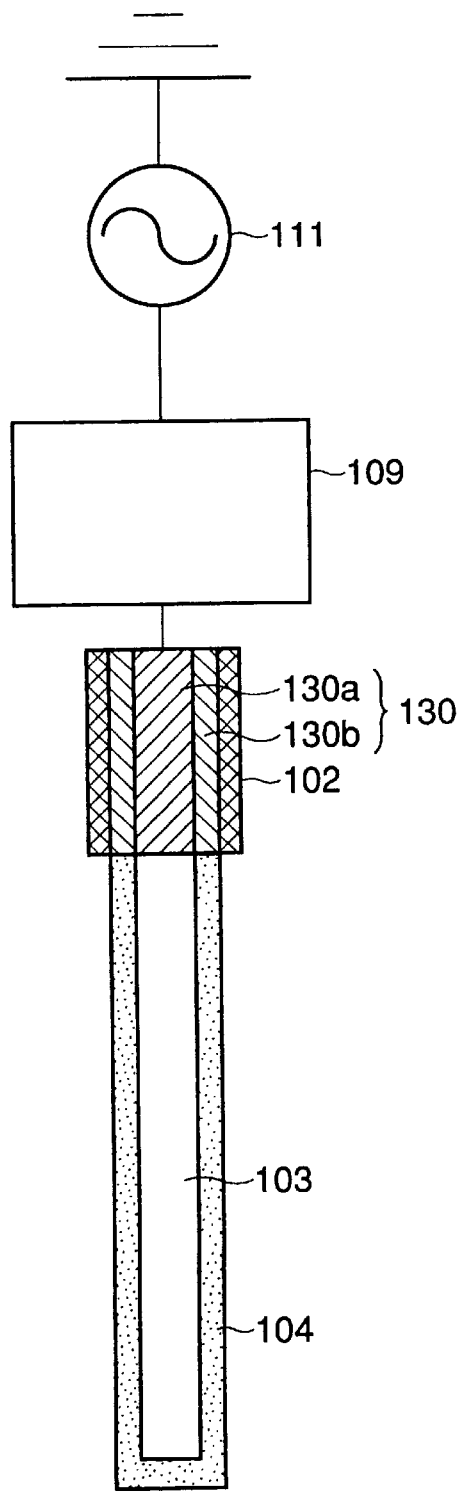
FIG. 4 is a schematic diagram for explaining a preferred example of the connection part between the cathode electrode and the transmission line.

An example is one as shown in FIG. 4 wherein cylindrical cathode electrode (103) and dielectric cover (104) are made in the same cross-sectional shape and of the same material as inner conductor (130a) and transmission medium (130b), respectively, of transmission line (130) and wherein earth shield (102) of an electrically conductive material or the like is given over the outside of this concentric transmission line (130).

According to this arrangement, the impedance of the cathode electrode portion has only an additional impedance due to the thickness of ion sheath and the resistance of plasma greater than the impedance of the transmission line, so that the impedance gap is relatively small and the RF electromagnetic field coming from the transmission line is mainly transmitted to the cathode electrode, thereby suppressing the uneven distribution of plasma at the inlet portion and transmission of RF to the substrate.

Further, in order to make the impedance of the high-frequency transmission circuit as equal as possible to the impedance of the cathode electrode portion, thereby transmitting the high-frequency power only to the cathode electrode as far as possible, it is desirable that the transmission line is formed as a coaxial transmission line comprising a columnar inner conductor with an outer diameter A1, a cylindrical earth shield with a bore diameter B1 and a cylindrical transmission medium with a dielectric constant $\epsilon 1$, that the cathode electrode portion is formed of a columnar cathode electrode with an outer diameter A2 covered with a cylindrical dielectric cover with a dielectric constant $\epsilon 2$ and an outer diameter B2, and that the dimensions and dielectric constants of the members which form the transmission line and the cathode electrode portion satisfy the relation expressed by Equation (1)

$$0.9 \times \sqrt{\frac{1}{\epsilon 1}} \times \ln\left(\frac{B1}{A1}\right) \leq \sqrt{\frac{1}{\epsilon 2}} \times \ln\left(\frac{B2}{A2}\right) \leq 1.1 \times \sqrt{\frac{1}{\epsilon 1}} \times \ln\left(\frac{B1}{A1}\right). \quad (1)$$

Since the characteristic impedance of a coaxial transmission line formed of an inner conductor with an outer diameter A, an outer conductor with a bore diameter B and a dielectric member with a dielectric constant $\epsilon$ is known to be proportional to $$\sqrt{\frac{1}{\epsilon 1}} \times \ln\left(\frac{B}{A}\right)$$

the impedance of the transmission line is proportional to $$\sqrt{\frac{1}{\epsilon 1}} \times \ln\left(\frac{B1}{A1}\right)$$

Further, when a plasma is regarded as an outer conductor, the impedance of the cathode electrode portion is proportional to $$\sqrt{\frac{1}{\epsilon 2}} \times \ln\left(\frac{B2}{A2}\right)$$

Accordingly, when the relation expressed by Equation (1) is satisfied, the impedance gap between the transmission line and the cathode electrode portion is small, so that the high-frequency electromagnetic field coming from the transmission line is transmitted mainly to the cathode electrode, whereby the uneven distribution of plasma at the inlet portion and transmission of the high-frequency to the substrate are suppressed.

Further, when the relation expressed by Equation (1) is satisfied, and when the relation B1<B2 is satisfied, the high-frequency electromagnetic field transmitted between the inner conductor and the earth shield during transmission of the high-frequency power from the transmission line to the cathode electrode does not face the plasma in front thereof at the entrance from the transmission line to the cathode electrode, so that absorption of the high-frequency power by the plasma at the entrance is reduced, whereby the uneven distribution of plasma at the inlet portion and transmission of the high-frequency to the substrate are further suppressed.

The present invention has been accomplished on the basis of the above investigation results. The present invention will be described referring to the drawing.

Figure 5:
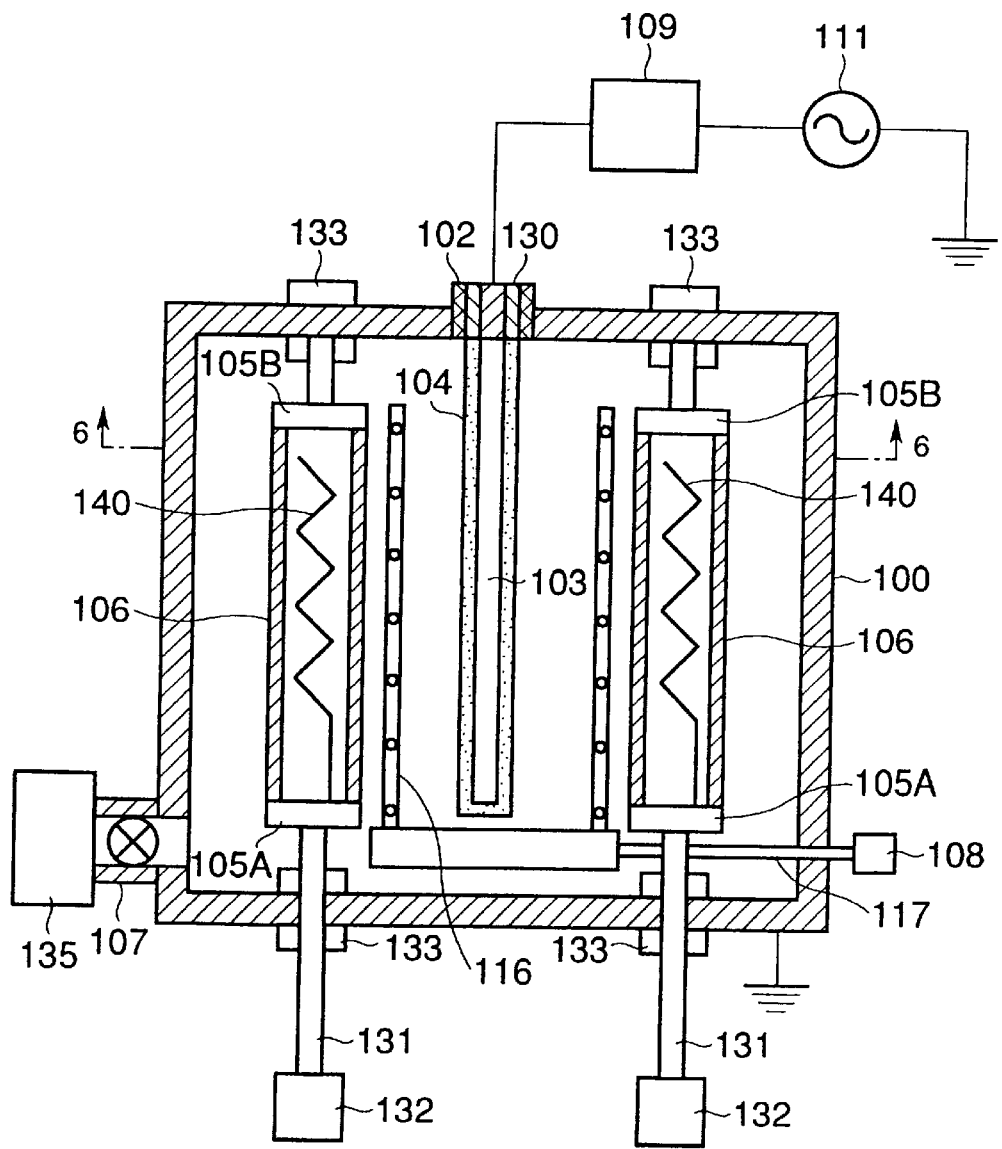
FIG. 5 is a schematic cross-sectional view to show a preferred example of the plasma process apparatus.
Figure 6:
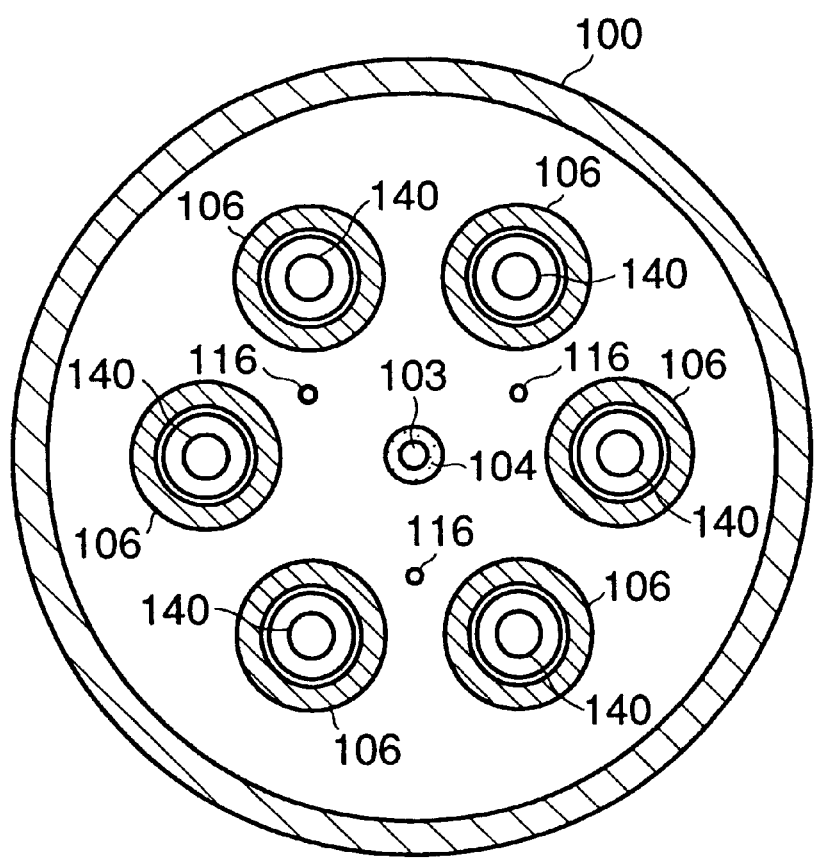
FIG. 6 is a schematic cross-sectional view to show a cross-section along 6—6 of the apparatus shown in FIG. 5.

The plasma CVD apparatus shown in FIG. 5 and FIG. 6 is a preferred example of the plasma CVD apparatus according to the present invention. FIG. 6 is a cross-sectional view along line 6—6 of FIG. 5. In FIG. 5 and FIG. 6, numeral 100 designates the reaction vessel. In the reaction vessel (100) there are six substrate holders (105A) disposed concentrically at predetermined intervals. Numeral 106 designates cylindrical substrates for film formation disposed on the respective substrate holders (105A). A heater (140) is provided inside of each substrate holder (105A) and is arranged to heat the cylindrical substrate (106) from inside. Each substrate holder (105A) is connected to a shaft (131) connected to a motor (132) to be rotated thereby. Numeral 105B denotes auxiliary holding members of cylindrical substrate (106). Numeral 103 represents the cathode electrode for input of RF power located at the center of the plasma generation region. This cathode electrode (103) is connected through the matching circuit (109) to the RF generator (111). The cathode electrode (103) is covered by the dielectric cover (104). Numeral 130 represents the transmission line also serving as a cathode electrode supporting member. Numeral 107 stands for an exhaust pipe provided with an exhaust valve and this exhaust pipe is in communication with an evacuation mechanism (135) provided with a vacuum pump. Numeral 108 represents a raw-material gas supply source comprised of a gas bomb, a mass flow controller, a valve, and so on. This raw-material gas supply source (108) is connected through gas supply pipe (117) to gas discharge pipes (116) having a plurality of gas discharge holes. Numeral 133 designates seal members.

The plasma CVD is carried out as follows using the above apparatus. The reaction vessel (100) is evacuated to a high vacuum by the evacuation mechanism (135) and thereafter the raw-material gas is introduced from the gas supply source (108) through the gas supply pipe (117) and gas discharge pipes (116) into the reaction vessel (100) to maintain the inside of vessel under predetermined pressure. After thus set, the RF power is supplied from the RF power supply (111) through the matching circuit (109) to the cathode electrode (103) to generate the plasma between the cathode electrode (103) and the cylindrical substrates (106). This causes the plasma to decompose and excite the raw-material gas, thereby forming a deposited film on the cylindrical substrates (106).

FIG. 4 shows an example of the configuration of cathode electrode and transmission line in the plasma CVD apparatus of the present invention. The cathode electrode (103) and dielectric cover (104) shown in FIG. 4 are those of a simple cylindrical shape, but the shape may be arbitrarily determined in the other portions than the inlet portion, for example with changing outer diameters midway, taking account of the frequency of the RF generator used and the length of the cathode electrode (103) along the axial direction.

In the present invention the preferred shapes for the cathode electrode are rod shapes of circular cylinder, circular tube, polygonal prism, and the like. In the present invention, the dielectric material used for the dielectric cover (104) may be selected from any conventional dielectric materials, preferably from materials with small dielectric loss. Preferable materials are those with dielectric loss tangent of not more than 0.01, more preferably of not more than 0.001. Preferred polymer dielectric materials are polytetrafluoroethylene, polytrifluorochloroethylene, polyfluoroethylenepropylene, polyimide, and so on. Preferred glass materials are silica glass, boro-silicate glass, and so on. Preferred porcelain materials are those mainly containing boron nitride, silicon nitride, aluminum nitride, or the like, or those mainly containing one or more element oxides among those such as aluminum oxide, magnesium oxide, and silicon oxide.

In the present invention, the frequency of the RF generator is preferably in the range of 30 to 600 MHz, and more preferably in the range of 60 to 300 MHz.

Figure 7:
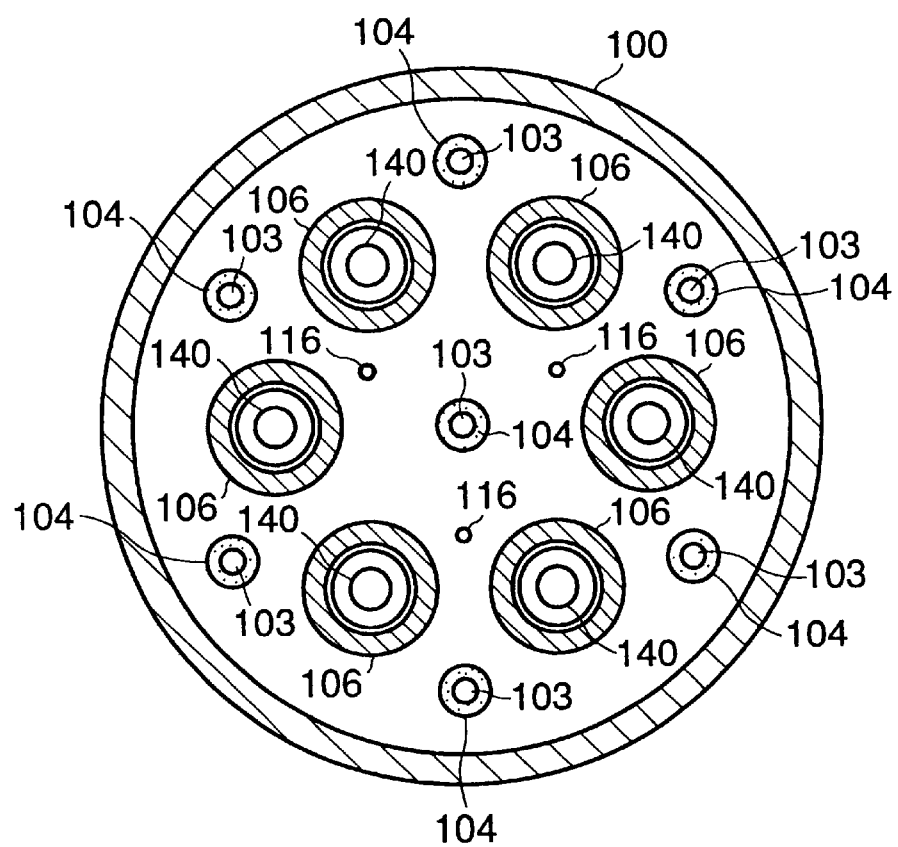
FIG. 7 is a schematic cross-sectional view for explaining another preferred plasma process apparatus, observed along the same direction as in FIG. 6.

The plasma CVD apparatus of the present invention may be constructed in such a configuration that a plurality of cathode electrodes (103) are arranged around the cylindrical substrates (106) as shown in FIG. 7. This configuration always exposes the entire surfaces of the cylindrical substrates to the plasma upon formation of film, which can greatly increase the deposition rate and in turn greatly improve the productivity. Further, by optimizing the number of cathode electrodes and locations thereof, it becomes possible to form a uniform deposit film over the entire surface of substrate without rotating the cylindrical substrate, which eliminates the need for the rotating mechanism, thus simplifying the construction of apparatus. It is needless to mention that rotation of cylindrical substrate can form a much more uniform and homogeneous deposit film.

Figure 8:
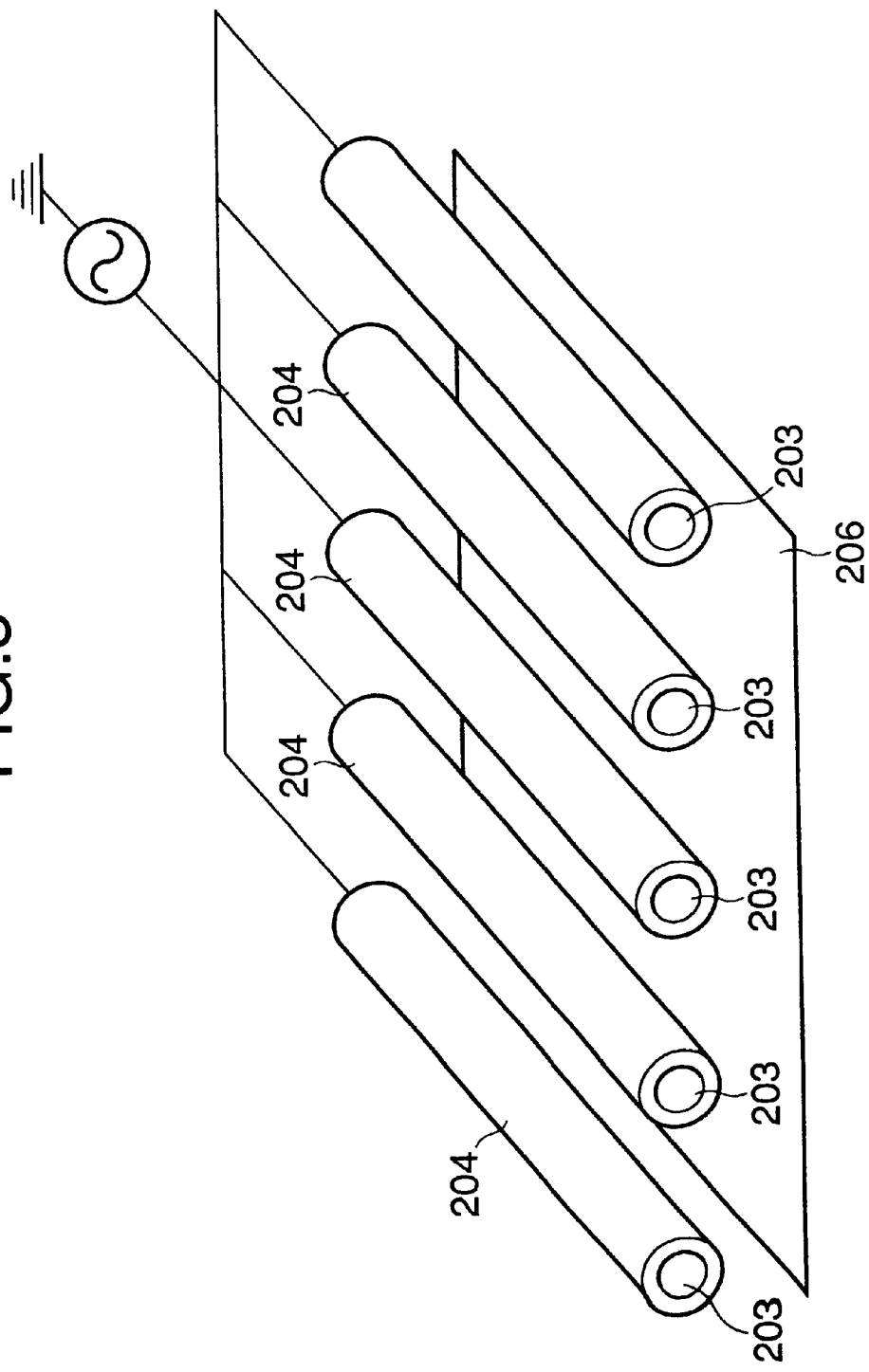
FIG. 8 is a schematic perspective view for explaining an example of the positional relation of still another preferred plasma process apparatus.

The apparatus configuration of the plasma CVD apparatus according to the present invention may be such that a plurality of cathode electrodes (203) are positioned in parallel with a flat plate substrate (206), as shown in FIG. 8. Employing this configuration, a homogeneous deposited film with very uniform thickness can be formed at a high rate on a large-area flat plate substrate.

Figure 9:
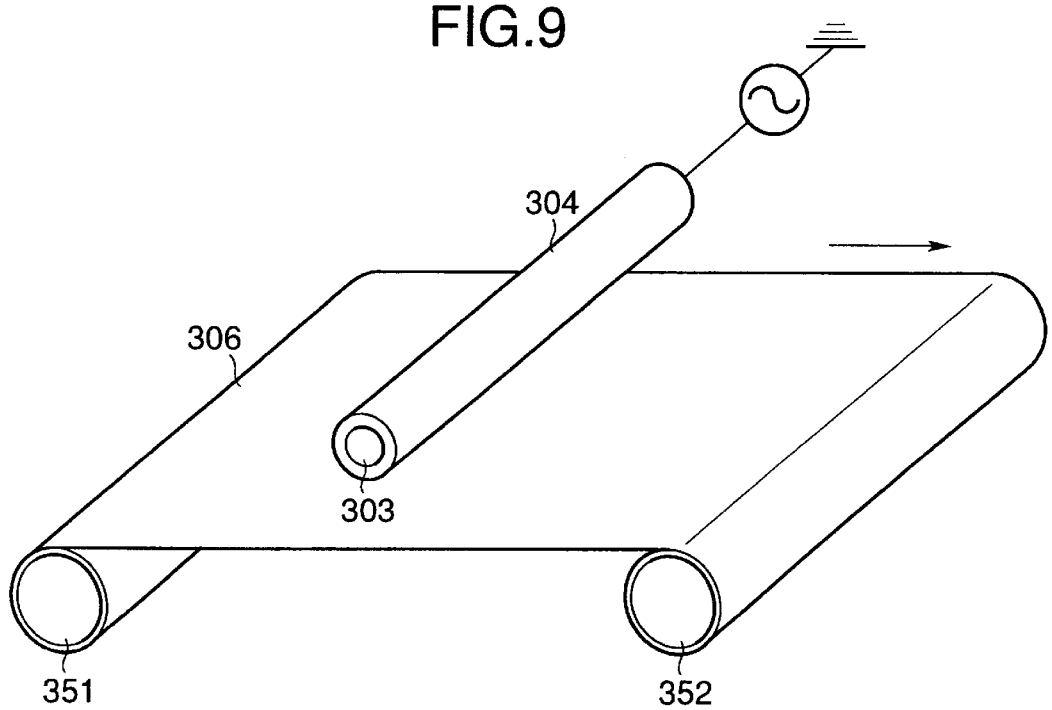
FIG. 9 is a schematic perspective view for explaining an example of the positional relation of still another preferred plasma process apparatus.

Another plasma CVD apparatus of the present invention may be constructed, as shown in FIG. 9, in such a configuration that a single cathode electrode or a plurality of cathode electrodes (303) are arranged in parallel with a sheet substrate (306) fed out from a holding roll (351) and wound up onto a winding roll (352) upon formation of film. Employing this configuration, a homogeneous deposit film with extremely uniform thickness can be formed at a high rate on a large-area sheet substrate.

As for the gas used in the plasma CVD apparatus of the present invention, one of the conventional raw-material gases contributing to film formation is properly selected depending upon a type of deposited film formed.

For example, for forming an amorphous silicon based deposited film, examples of preferred raw-material gases include silane, disilane, higher-order silane, etc., and mixture gases thereof. For forming other deposited films, examples of raw-material gases include raw-material gases such as germane, methane, and ethylene, and mixture gases thereof. In either case, the raw-material gas for formation of film can be introduced together with carrier gas into the reaction vessel. Examples of the carrier gas include hydrogen gas, inert gases such as argon gas and helium gas, and so on.

In the present invention, property improving gas may be used, for example, for adjusting the band gap of the deposited film. Examples of such gases include gases containing nitrogen atom, such as nitrogen or ammonia, gases containing oxygen atom, such as oxygen, nitrogen oxide, and dinitrogen oxide, hydrocarbon gases such as methane, ethane, ethylene, acetylene, and propane, fluorine compound gases such as silicon tetrafluoride, disilicon hexafluoride, and germanium tetrafluoride, mixture gases thereof, and so on.

In the present invention, dopant gas may be used in doping of the deposited film formed. Examples of the doping gas include gases of diborane, boron fluoride, phosphine, phosphorus fluoride, and so on.

The temperature of substrate upon formation of the deposited film in the present invention may be set as occasion demands, but, for forming the amorphous silicon based deposited film, the temperature is preferably in the range of 60 to 400° C., more preferably in the range of 100 to 350° C.

For etching, halogen based etching gas such as $CF_4$ or $CCl_4$ is preferably used, and for ashing, oxygen gas is preferably used. In such cases the carrier gas can also be used as occasion demands.

The present invention will be further described with examples, but it is noted that the present invention is by no means intended to be limited to these examples.

EXAMPLE 1

The plasma CVD apparatus shown in FIG. 5 and FIG. 6 was used, to which the RF generator with the frequency range of 30 to 600 MHz was connected. The cathode electrode was constructed in the structure shown in FIG. 4 wherein the cylindrical cathode electrode (103) was covered by the dielectric cover (104) of alumina ceramic, the inner conductor (130a) of the transmission line (130) was a continuous body from the cathode electrode (103), having the same outer diameter as the cathode electrode did, and the transmission medium (130b) of the transmission line was constructed of a cylindrical dielectric having the same inner diameter and outer diameter and being the same material as the dielectric cover (104). As keeping the other film-forming conditions than the above equal to those in Comparative Example 1 described hereinafter, specifically, under such conditions that RF power: 1 KW, flow rate of $SiH_4$ gas: 500 sccm, film-forming pressure: 50 mTorr, 25 mTorr, or 5 mTorr, and temperature of substrate: 250° C., and in the same film-forming procedures as in Comparative Example 1, an amorphous silicon film was formed on each of cylindrical substrates (106) and on a substrate for evaluation of electrical characteristics.

The amorphous silicon films formed as described above were evaluated as to the film quality and the film quality distribution, and as to the deposition rate and the deposition rate distribution by the same evaluation methods as in Comparative Example 1. Evaluation results of photosensitivity on the samples film-formed under the three pressure conditions of 50 mTorr, 25 mTorr, and 5 mTorr are shown in Table 1, Table 2, and Table 3, and evaluation results of deposition rate are shown in Table 4, Table 5, and Table 6. Table 7 shows the film-forming conditions together with those of the other examples and comparative examples.

In the samples by the RF energy with the frequency of 30 MHz, all the samples film-formed under the pressure condition of 50 mTorr showed the photosensitivities in the range of $8\times10^3$ to $2\times10^4$, which were film characteristics having no practical problem (Δ) or good film characteristics (○) (Table 1). The mean deposition rate was 0.5 nm/s and the deposition rate distribution was 6% (Table 4). All the samples film-formed under the pressure condition of 25 mTorr showed the photosensitivities in the range of $1\times10^4$ to $3\times10^4$, which were good film characteristics (○) (Table 2). The mean deposition rate was 0.5 nm/s and the deposition rate distribution was 6% (Table 5). Discharge was unable to take place under the pressure condition of 5 mTorr.

In the samples by the RF energy with the frequencies of 60 to 300 MHz, all the samples film-formed under the pressure condition of 50 mTorr showed the photosensitivities in the range of $1\times10^4$ to $3\times10^4$, which were good film characteristics (○) (Table 1). The mean deposition rates were 1 to 1.8 nm/s and the deposition rate distributions were 4 to 6% (Table 4). All the samples film-formed under the pressure condition of 25 mTorr showed the photosensitivities in the range of $4\times10^4$ to $8\times10^4$, which were good film characteristics (○) (Table 2). The mean deposition rates were 0.9 to 2.0 nm/s and the deposition rate distributions were 4 to 5% (Table 5). All the samples film-formed under the pressure condition of 5 mTorr showed the photosensitivities in the range of $1\times10^5$ to $5\times10^5$, which were very excellent film characteristics (◎) (Table 3). The mean deposition rates were 0.8 to 1.7 nm/s and the deposition rate distributions were 4% (Table 6).

In the samples by the RF energy with the frequencies of 400 to 600 MHz, all the samples film-formed under the pressure condition of 50 mTorr showed the photosensitivities in the range of $7\times10^3$ to $1\times10^4$, which were film characteristics having no practical problem (Δ) (Table 1). The mean deposition rates were 0.6 to 0.7 nm/s and the deposition rate distributions were 6 to 8% (Table 4). All the samples film-formed under the pressure condition of 25 mTorr showed the photosensitivities in the range of $1\times10^4$ to $3\times10^4$, which were good film characteristics (○) (Table 2). The mean deposition rates were 0.6 to 0.7 nm/s and the deposition rate distributions were 6 to 8% (Table 5). All the samples film-formed under the pressure condition of 5 mTorr showed the photosensitivities in the range of $5\times10^4$ to $8\times10^4$, which were good film characteristics (○) (Table 3). The mean deposition rates were 0.5 to 0.7 nm/s and the deposition rate distributions were 6 to 7% (Table 6).

TABLE 1

Power Freq. — Photosensitivity (film-forming pressure: 50 mTorr)

| (MHz) | upper side (RF inlet side) | | | | | | | | ← Center → | | | | | | | | | lower side |
|---|---|---|---|---|---|---|---|---|---|---|---|---|---|---|---|---|---|---|
| 30 | Δ | ○ | Δ | ○ | ○ | Δ | Δ | Δ | ○ | Δ | Δ | ○ | Δ | Δ | ○ | ○ | ○ | ○ |
| 60 | ○ | ○ | ○ | ○ | ○ | ○ | ○ | ○ | ○ | ○ | ○ | ○ | ○ | ○ | ○ | ○ | ○ | ○ |
| 100 | ○ | ○ | ○ | ○ | ○ | ○ | ○ | ○ | ○ | ○ | ○ | ○ | ○ | ○ | ○ | ○ | ○ | ○ |
| 200 | ○ | ○ | ○ | ○ | ○ | ○ | ○ | ○ | ○ | ○ | ○ | ○ | ○ | ○ | ○ | ○ | ○ | ○ |
| 300 | ○ | ○ | ○ | ○ | ○ | ○ | ○ | ○ | ○ | ○ | ○ | ○ | ○ | ○ | ○ | ○ | ○ | ○ |
| 400 | Δ | Δ | Δ | Δ | Δ | Δ | Δ | Δ | Δ | Δ | Δ | Δ | Δ | Δ | Δ | Δ | Δ | Δ |
| 500 | Δ | Δ | Δ | Δ | Δ | Δ | Δ | Δ | Δ | Δ | Δ | Δ | Δ | Δ | Δ | Δ | Δ | Δ |
| 600 | Δ | Δ | Δ | Δ | Δ | Δ | Δ | Δ | Δ | Δ | Δ | Δ | Δ | Δ | Δ | Δ | Δ | Δ |

TABLE 2

Power Freq. — Photosensitivity (film-forming pressure: 25 mTorr)

| (MHz) | upper side (RF inlet side) | | | | | | | | ← Center → | | | | | | | | | lower side |
|---|---|---|---|---|---|---|---|---|---|---|---|---|---|---|---|---|---|---|
| 30 | ○ | ○ | ○ | ○ | ○ | ○ | ○ | ○ | ○ | ○ | ○ | ○ | ○ | ○ | ○ | ○ | ○ | ○ |
| 60 | ○ | ○ | ○ | ○ | ○ | ○ | ○ | ○ | ○ | ○ | ○ | ○ | ○ | ○ | ○ | ○ | ○ | ○ |
| 100 | ○ | ○ | ○ | ○ | ○ | ○ | ○ | ○ | ○ | ○ | ○ | ○ | ○ | ○ | ○ | ○ | ○ | ○ |
| 200 | ○ | ○ | ○ | ○ | ○ | ○ | ○ | ○ | ○ | ○ | ○ | ○ | ○ | ○ | ○ | ○ | ○ | ○ |
| 300 | ○ | ○ | ○ | ○ | ○ | ○ | ○ | ○ | ○ | ○ | ○ | ○ | ○ | ○ | ○ | ○ | ○ | ○ |
| 400 | ○ | ○ | ○ | ○ | ○ | ○ | ○ | ○ | ○ | ○ | ○ | ○ | ○ | ○ | ○ | ○ | ○ | ○ |
| 500 | ○ | ○ | ○ | ○ | ○ | ○ | ○ | ○ | ○ | ○ | ○ | ○ | ○ | ○ | ○ | ○ | ○ | ○ |
| 600 | ○ | ○ | ○ | ○ | ○ | ○ | ○ | ○ | ○ | ○ | ○ | ○ | ○ | ○ | ○ | ○ | ○ | ○ |

TABLE 3

Power Freq. — Photosensitivity (film-forming pressure: 5 mTorr)

| (MHz) | upper side (RF inlet side) | | | | | | | | ← Center → | | | | | | | | | lower side |
|---|---|---|---|---|---|---|---|---|---|---|---|---|---|---|---|---|---|---|
| 30* | — | — | — | — | — | — | — | — | — | — | — | — | — | — | — | — | — | — |
| 60 | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ |
| 100 | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ |
| 200 | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ |
| 300 | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ | ⊙ |
| 400 | ○ | ○ | ○ | ○ | ○ | ○ | ○ | ○ | ○ | ○ | ○ | ○ | ○ | ○ | ○ | ○ | ○ | ○ |
| 500 | ○ | ○ | ○ | ○ | ○ | ○ | ○ | ○ | ○ | ○ | ○ | ○ | ○ | ○ | ○ | ○ | ○ | ○ |
| 600 | ○ | ○ | ○ | ○ | ○ | ○ | ○ | ○ | ○ | ○ | ○ | ○ | ○ | ○ | ○ | ○ | ○ | ○ |

*Evaluation was not applicable to formation of film, because no discharge occurred.

TABLE 4

| Power frequency (MHz) | Mean deposition rate (nm/s) | Distribution of deposition rate (%) |
|---|---|---|
| 30 | 0.5 | 6 |
| 60 | 1.0 | 6 |
| 100 | 1.6 | 5 |
| 200 | 1.8 | 5 |
| 300 | 1.6 | 4 |
| 400 | 0.7 | 6 |
| 500 | 0.7 | 7 |
| 600 | 0.6 | 8 |

Film-forming pressure: 50 mTorr

TABLE 5

| Power frequency (MHz) | Mean deposition rate (nm/s) | Distribution of deposition rate (%) |
|---|---|---|
| 30 | 0.5 | 6 |
| 60 | 0.9 | 5 |
| 100 | 1.7 | 4 |
| 200 | 2.0 | 4 |
| 300 | 1.5 | 4 |
| 400 | 0.7 | 6 |
| 500 | 0.7 | 7 |
| 600 | 0.6 | 7 |

Film-forming pressure: 25 mTorr

TABLE 6

| Power frequency (MHz) | Mean deposition rate (nm/s) | Distribution of deposition rate (%) |
|---|---|---|
| 30* | — | — |
| 60 | 0.8 | 4 |
| 100 | 1.6 | 4 |
| 200 | 1.7 | 4 |
| 300 | 1.4 | 4 |
| 400 | 0.7 | 6 |
| 500 | 0.6 | 7 |
| 600 | 0.5 | 7 |

Film-forming pressure: 5 mTorr
*Evaluation was not applicable to formation of film, because no discharge occurred.

TABLE 7

| | RF power (KW) | Flow rate of SiH$_4$ Gas (sccm) | Film-forming pressure (mTorr) | Temp. of Substrate (° C.) | Power frequency (MHz) |
|---|---|---|---|---|---|
| Example 1 | 1 | 500 | 5, 25, 50 | 250 | 30–600 |
| Example 3 | 0.8 per electrode | 1500 | 8 | 200 | 100 |
| Example 5 | 0.8 per electrode | 1500 | 8 | 200 | 100 |
| Example 7 | 0.5 per electrode | 400 | 15 | 300 | 250 |
| Example 8 | 1 | 500 | 10 | 250 | 550 |
| Comp. Ex 1 | 1 | 500 | 5, 25, 50 | 250 | 13.56–650 |
| Comp. Ex 2 | 0.5 per electrode | 400 | 15 | 300 | 250 |
| Comp. Ex 3 | 2 | 400 | 15 | 300 | 250 |

EXAMPLE 2

Using the plasma CVD apparatus shown in FIG. 5 and FIG. 6, electrophotographic photosensitive members were fabricated under the conditions under which the values of photosensitivity over $10^5$ in Example 1 were attained, i.e., under the respective conditions of the film-forming pressure: 5 mTorr and the power frequency: 60 MHz, 100 MHz, 200 MHz, and 300 MHz. The cathode electrode (103), dielectric cover (104), and transmission line (130) were those of the same shape and same material as those used in Example 1 for each of the power-supply frequencies.

The electrophotographic photosensitive members were formed by depositing the charge injection preventing layer, photoconductive layer, and surface protection layer in this order on six Al cylindrical substrates under the film-forming conditions shown in Table 8.

The samples obtained under the conditions of respective power frequencies were evaluated as to chargeability, image density, and image defect. As a result, all the electrophotographic photosensitive members showed very excellent results throughout the entire surface of electrophotographic photosensitive member as to these evaluation items. This proves that all the electrophotographic photosensitive members are excellent in electrophotographic characteristics.

TABLE 8

| Electrophotographic photosensitive layer | Film-forming conditions |
|---|---|
| Surface protection layer | flow rate of SiH$_4$ gas: 100 sccm<br>flow rate of H$_2$ gas: 100 sccm<br>flow rate of CH$_4$ gas: 500 sccm<br>supply power: 800 W<br>reaction pressure: 5 mTorr<br>film thickness: 1 μm |
| Photoconductive layer | flow rate of SiH$_4$ gas: 400 sccm<br>flow rate of H$_2$ gas: 400 sccm<br>supply power: 1000 W<br>reaction pressure: 5 mTorr<br>film thickness: 25 μm |
| Charge injection preventing layer | flow rate of SiH$_4$ gas: 400 sccm<br>flow rate of H$_2$ gas: 400 sccm<br>flow rate of NO gas: 500 sccm<br>flow rate of B$_2$H$_6$ gas: 2000 ppm<br>supply power: 800 W<br>reaction pressure: 5 mTorr<br>film thickness: 1 μm |

EXAMPLE 3

Using the plasma CVD apparatus shown in FIG. 7, six Al cylindrical substrates (106) having the diameter of 108 mm, the length of 358 mm, and the thickness of 5 mm were placed in the reaction vessel (100) and formation of film was carried out without rotating the substrates. The configuration of the cathode electrode system was that shown in FIG. 4. Namely, the cylindrical cathode electrodes (103) made of Al and having the total length of 450 mm, which were made in the same outer diameter and of the same material as the inner conductor (130b) of transmission line, were covered by alumina ceramic dielectric cover (104) having the same inner diameter and same outer diameter and made of the same material as the transmission medium (130b) of transmission line, and seven cathode electrodes were placed in the reaction vessel, as shown in FIG. 7.

Setting the frequency of the RF generator at 100 MHz, the amorphous silicon film was formed on the six cylindrical substrates under the film-forming conditions shown in Table 7.

Evaluation of deposition rate and deposition rate distribution was carried out in the following procedures. For 180 intersecting points obtained by drawing lines at intervals of about 20 mm in the axial direction and lines at intervals of about 32 mm in the circumferential direction on one of the six cylindrical substrates with the amorphous silicon film formed thereon, film thicknesses were measured with an eddy-current type film thickness meter used in Comparative Example 1, the deposition rate was calculated at each measurement point, and a mean deposition rate was calculated as a mean value of the thus obtained values. The mean deposition rate obtained was 7.2 nm/s. The deposition rate distribution in the axial direction was obtained as follows. First, a difference was obtained between the maximum and the minimum out of the deposition rates at eighteen measurement points on one line in the axial direction and this difference was divided by a mean deposition rate of the eighteen points, thereby attaining the deposition rate distribution per line. Next, the deposition rate distribution per line was also obtained in the same manner for each of the other nine lines, then a mean value of deposition rate distributions of ten lines obtained was calculated, and it was expressed in percentage as a deposition rate distribution in the axial direction. The deposition rate distribution in the axial direction was 5%. The deposition rate distribution in the circumferential direction was obtained as follows. A difference was obtained between the maximum and the minimum out of the deposition rates at ten measurement points on a line in the circumferential direction and then this difference was divided by the mean deposition rate of the ten points, thus obtaining a deposition rate distribution per line. Next, the deposition rate distribution per line was also calculated in the same manner for each of the other seventeen lines, and a mean value of deposition rate distributions of eighteen lines thus obtained was calculated and was expressed in percentage as a deposition rate distribution in the circumferential direction. The deposition rate distribution in the circumferential direction was 9%.

EXAMPLE 4

Electrophotographic photosensitive members were fabricated without rotating the substrates, using the same plasma CVD apparatus as in Example 3. The electrophotographic photosensitive members were formed by depositing the charge injection preventing layer, photoconductive layer, and surface protection layer in this order on six Al cylindrical substrates under the film-forming conditions shown in FIG. 9.

The samples obtained were evaluated as to the chargeability, image density, and image defect. As a result, all the electrophotographic photosensitive members also showed very excellent results throughout the entire surface of electrophotographic photosensitive member as to these evaluation items. This proves that all the electrophotographic photosensitive members are excellent in electrophotographic characteristics.

TABLE 9

| Electrophotographic photosensitive layer | Film-forming conditions |
| --- | --- |
| Surface protection layer | flow rate of $SiH_4$ gas: 300 sccm<br>flow rate of $H_2$ gas: 300 sccm<br>flow rate of $CH_4$ gas: 1500 sccm<br>supply power: 500 W<br>reaction pressure: 5 mTorr<br>film thickness: 1 μm |
| Photocondcutive layer | flow rate of $SiH_4$ gas: 1500 sccm<br>flow rate of $H_2$ gas: 400 sccm<br>supply power: 800 W (per electrode)<br>reaction pressure: 5 mTorr<br>film thickness: 25 μm |
| Charge injection preventing layer | flow rate of $SiH_4$ gas: 1000 sccm<br>flow rate of $H_2$ gas: 1000 sccm |

TABLE 9-continued

| Electrophotographic photosensitive layer | Film-forming conditions |
| --- | --- |
| | flow rate of NO gas: 1200 sccm<br>flow rate of $B_2H_6$ gas: 2000 ppm<br>supply power: 500 W (per electrode)<br>reaction pressure: 5 mTorr<br>film thickness: 1 μm |

EXAMPLE 5

The amorphous silicon film was formed on each of six cylindrical substrates in the same manner as in Example 3 except that the substrates were rotated upon formation of film. The deposition rate and the deposition rate distribution were evaluated in the same manner as in Example 3. The mean deposition rate was 7.2 nm/s, the deposition rate distribution in the axial direction was 5%, and the deposition rate distribution in the circumferential direction was 3%.

EXAMPLE 6

In the same plasma CVD apparatus as in Example 5, electrophotographic photosensitive members were fabricated with rotating the substrates upon formation of film. The electrophotographic photosensitive members were formed by depositing the charge injection preventing layer, photoconductive layer, and surface protection layer in this order on six Al cylindrical substrates under the film-forming conditions shown in Table 9. The samples obtained were evaluated as to the chargeability, image density, and image defect. As a result, all the electrophotographic photosensitive members also showed very excellent results throughout the entire surface of electrophotographic photosensitive member as to these evaluation items. This proves that all the electrophotographic photosensitive members are also excellent in electrophotographic characteristics.

EXAMPLE 7

Using the plasma CVD apparatus having the configuration shown in FIG. 8, film formation was carried out by placing a glass flat plate substrate 500 mm long, 500 mm wide, and 1 mm thick in the reaction vessel. Cylindrical cathode electrodes (203) made of Al and having the length of 200 mm and the diameter of 25 mm were covered by alumina ceramic dielectric cover (204) having the length 605 mm, the inner diameter 26 mm, and the outer diameter 38 mm, and five such cathode electrodes were placed in the reaction vessel as shown in FIG. 8. Setting the frequency of RF generator at 250 MHz, the amorphous silicon film was formed on the flat plate substrate under the film-forming conditions shown in Table 7.

The deposition rate and the deposition rate distribution were evaluated in the following procedures. For 256 intersecting points obtained by drawing lines at intervals of about 30 mm in the longitudinal direction and lines at intervals of about 30 mm in the lateral direction of the flat plate substrate with the amorphous silicon film formed thereon, film thicknesses were measured with the eddy-current type film thickness meter used in Comparative Example 1 and the mean deposition rate was obtained as a mean value of calculated values of deposition rate at the respective measurement points. The mean deposition rate obtained was 6.5 nm/s. The deposition rate distribution was obtained in such a way that a difference was calculated between the maximum and the minimum out of the deposition rates at the 256 measurement points and this difference was divided by the mean deposition rate and was expressed in percentage as a deposition rate distribution. The deposition rate distribution obtained was 8%.

EXAMPLE 8

Using the plasma CVD apparatus having the configuration shown in FIG. 9, the sheet substrate (306) of stainless steel having the width of 500 mm and the thickness of 0.1 mm was placed in the reaction vessel and film formation was carried out as winding the sheet substrate up around the winding roll (352). The combination of the cathode electrode (303) and dielectric cover (304) was the same as in Example 7 and was set in the reaction vessel. Setting the frequency of the RF generator at 550 MHz, the amorphous silicon film was formed on the sheet substrate under the film-forming conditions shown in Table 7 and a sheet piece 500 mm long was cut out of the sheet substrate. Then the deposition rate and the deposition rate distribution were evaluated in the same procedures as in Example 7. The mean deposition rate obtained was 1.5 nm/s and the deposition rate distribution was 5%.

EXAMPLE 9

Figure 2:
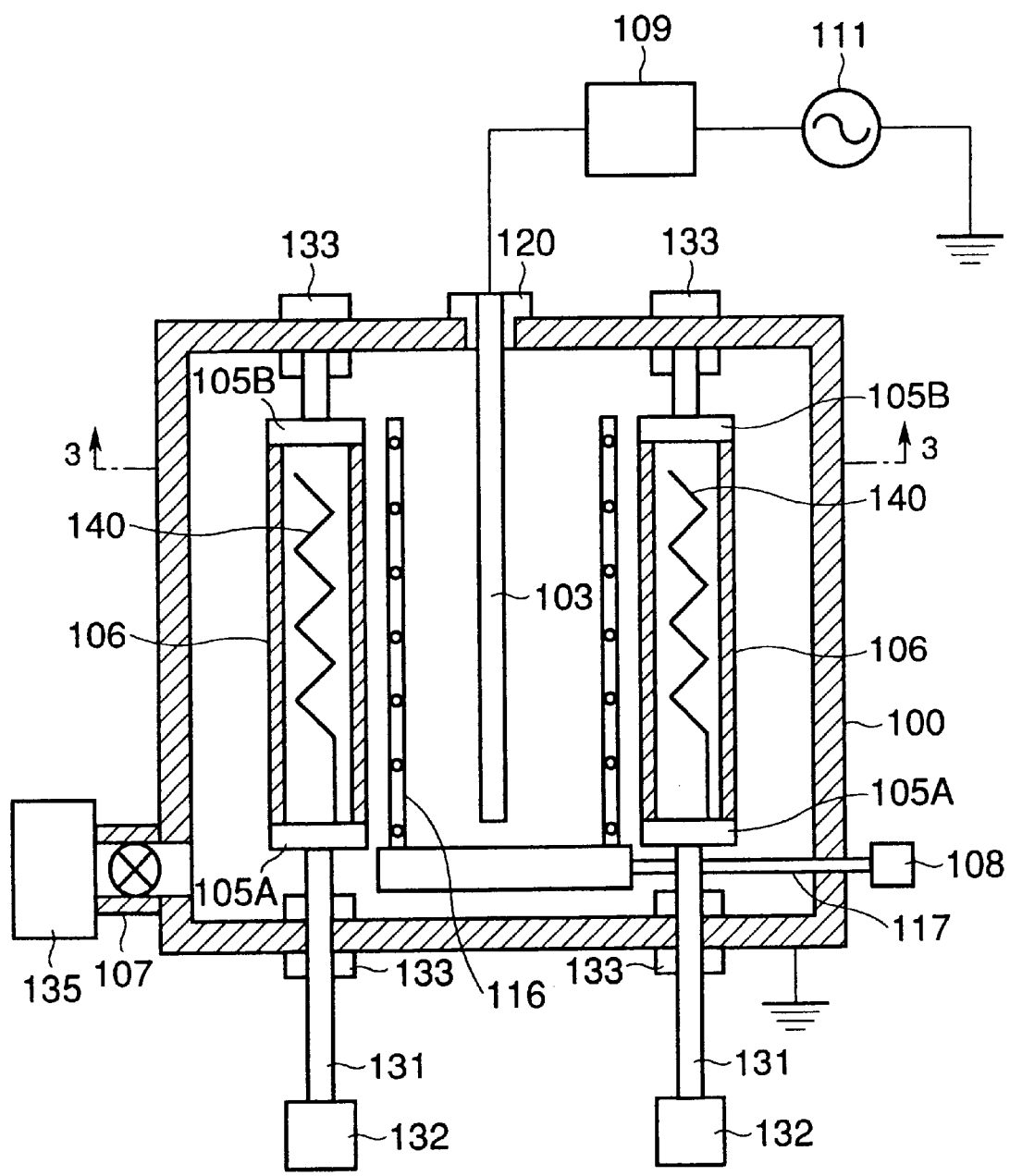
FIG. 2 is a schematic cross-sectional view to show an example of the plasma process apparatus.

Used was the plasma CVD apparatus shown in FIG. 1 and FIG. 2, to which a power source with a frequency of 100 MHz was connected. The cathode electrode portion was constructed in the structure shown in FIG. 4 wherein the columnar cathode electrode (103) with an outer diameter of 30 mm was covered by the dielectric cover (104) of alumina ceramic of a dielectric constant 10 with an outer diameter of 58 mm; the inner conductor (130a) of the transmission line (130) was a continuous body from the cathode electrode (103), having the same outer diameter as the cathode electrode; the transmission medium (130b) of the transmission line was formed of polytetrafluoroethylene of a dielectric constant 2; the ground shield (102) was used which had a bore diameter of 40 mm; and the impedance of the transmission line and the impedance of the cathode electrode portion satisfied the relation expressed by Equation (1).

With the film-forming pressure set to 5 mTorr and the other film-forming conditions set to be the same as those in Comparative Example 1 described hereinafter, specifically, under such conditions that the high-frequency power: 1 KW, the flow rate of $SiH_4$ gas: 500 sccm, and the temperature of substrate: 250° C., and in the same film-forming procedures as in Comparative Example 1, an amorphous silicon film was formed on each of cylindrical substrates (106) and on a substrate for evaluation of electrical characteristics.

The amorphous silicon films formed as described above were evaluated as to the film quality and the film quality distribution, and as to the deposition rate and the deposition rate distribution by the same evaluation methods as in Comparative Example 1.

As a result, the photosensitivities of all the samples were $2 \times 10^5$ to $5 \times 10^5$, which were very excellent film characteristics (a). The mean deposition rate was 1.5 nm/s and the deposition rate distribution was 3%.

COMPARATIVE EXAMPLE 1

Figure 3:
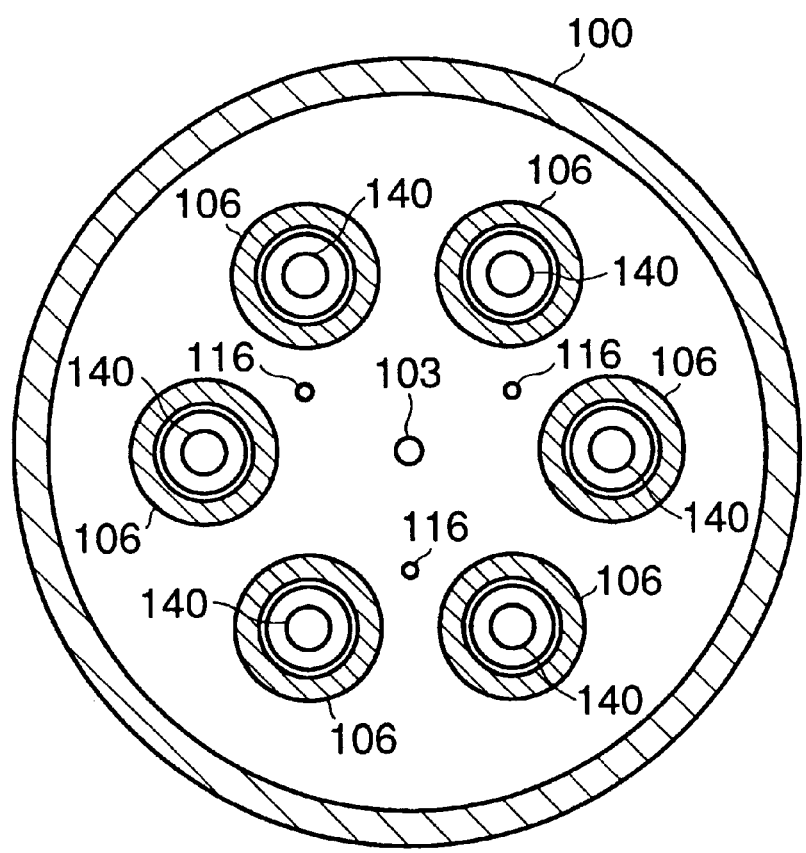
FIG. 3 is a schematic cross-sectional view to show a cross-section along 3—3 of the apparatus shown in FIG. 2.

Experiments were conducted based on the RF plasma CVD technology using the RF energy source described in Reference 2 cited previously. Specifically, in the plasma CVD apparatus shown in FIG. 2 and FIG. 3, the amorphous silicon film was formed over the entire peripheral surface of each cylindrical substrate, using RF generators of various frequencies. In formation of each amorphous silicon film, observation was made about influence of the frequency of RF generator on the film quality and film quality distribution of the deposited film and on the deposition rate and deposition rate distribution. At the initial stage experiments were carried out under the pressure condition of about 0.2 Torr as described in Reference 1, but, because of conspicuous generation of powder of polysilane or the like, the experiments were carried out in the following procedures under the pressure of 50 or less mTorr.

In the experiments, six Al cylindrical substrates having the diameter 108 mm, the length 358 mm, and the thickness 5 mm were set in the reaction vessel (100). Every formation of film was carried out with rotating the substrates. The cathode electrode (103) was one of a circular cylinder of Al having the diameter 30 mm and the length 450 mm. For evaluation of film quality, a Corning #7059 glass substrate with a comb-shaped electrode of Cr vapordeposited with gaps of 250 $\mu$m was set as an electrical characteristic evaluation substrate across the length 358 mm in the direction of rotation axis on a surface of one cylindrical substrate out of the six substrates, and then the operation was carried out in the following procedures.

First, the evacuation mechanism (135) was actuated to evacuate the inside of the reaction vessel (100) and the inside of the reaction vessel (100) was adjusted at the pressure of $1 \times 10^{-6}$ Torr. Then the heaters (140) were powered to heat the respective cylindrical substrates (106) to 250° C. and maintain them thereat.

Next, film formation was carried out in the following procedures. $SiH_4$ gas was introduced at the flow rate of 500 sccm from the raw-material gas supply source (108) through the gas supply pipe (117) and gas discharge pipes (116) into the reaction vessel (100) and the inside of this reaction vessel was controlled under the pressure of either one of three conditions of 50 mTorr, 25 mTorr, and 5 mTorr. Then RF wave in the frequency range of 13.56 to 650 MHz was generated at 1 KW by the RF generator (111) under each pressure condition and this RF wave was supplied through the matching circuit (109) to the cathode electrode (103). The RF generator (111) used herein was a predetermined RF generator capable of achieving the frequencies in the aforementioned range. The matching circuit (109) was adjusted with necessity depending upon the frequency of the RF generator. In this way the amorphous silicon film was formed on the cylindrical substrates (106) and on the aforementioned electric characteristic evaluation substrate.

The film quality and the film quality distribution were evaluated by measuring the photosensitivity ((photoconductivity σp)/(dark conductivity σd)) at eighteen points located at intervals of about 20 mm from the top edge to the bottom edge of the electric characteristic evaluation substrate. Here, the photoconductivity σp was evaluated by a conductivity upon exposure to He-Ne laser (wavelength 632.8 nm) having the intensity of 1 mW/cm$^2$.

According to the knowledge of the inventors from fabrication of electrophotographic photosensitive member heretofore, images deserving practical use can be obtained from the electrophotographic photosensitive member fabricated under optimization based on the conditions capable of obtaining the deposited film in the quality with the photosensitivity not less than $10^3$ according to the above method.

However, the recent high-contrast tendency of image makes the above photosensitivity of not less than $10^4$ essential and it is expected that the photosensitivity of $10^5$ or more will be demanded in the near future. From this point of view, values of photosensitivity were evaluated by the following standards in the experiments this time. The photosensitivity of $10^5$ or more: ⊚ (very excellent film characteristics), the photosensitivity of from $10^4$ inclusive to $10^5$: ○ (good film characteristics), the photosensitivity of from $10^3$ inclusive to $10^4$: Δ (characteristics with no practical problem), and the photosensitivity of less than $10^3$: x (characteristics not suitable for practical use).

Evaluation of deposition rate and deposition rate distribution was carried out as follows. Film thicknesses were measured using the eddy-current type film thickness meter (available from Kett science laboratory) at the eighteen points located at intervals of about 20 mm in the same manner as the measurement positions of photosensitivity as described above, along the axial direction of one out of the five cylindrical substrates with the amorphous silicon film formed thereon, except for the one with the Corning #7059 substrate for evaluation of film quality among the six cylindrical substrates. Deposition rates were calculated based on the film thicknesses at the eighteen points and a mean deposition rate was obtained as a mean value of the thus obtained values. Evaluation of deposition rate distribution was carried out as follows. Specifically, the deposition rate distribution in the axial direction was obtained as follows. A difference was obtained between the maximum and the minimum of the deposition rates at the eighteen points in the axial direction, the difference was divided by the mean deposition rate of the eighteen points, and the deposition rate distribution ((maximum−minimum)/mean value) was calculated to be expressed in percentage as a deposition rate distribution in the axial direction.

For the respective samples film-formed under the pressure conditions of 50 mTorr, 25 mTorr, and 5 mTorr, evaluation results of photosensitivity are shown in Table 10, Table 11, and Table 12, and evaluation results of deposition rate are shown in Table 13, Table 14, and Table 15.

In the samples by the RF energy with the frequency of 13.56 MHz, the samples film-formed under the pressure condition of 50 mTorr showed relatively uniform film quality and deposition rate, but the mean deposition rate thereof was very low, 0.15 nm/s. Discharge was unable to take place under the pressure condition of 25 mTorr or less.

In the samples by the RF energy with the frequency of 30 MHz, the samples film-formed under the pressure conditions of 50 mTorr and 25 mTorr showed a drop of photosensitivity at positions of upper part of cylindrical substrate. The mean deposition rate of the samples film-formed under the pressure condition of 50 mTorr was increased approximately three times greater than that in the case of 13.56 MHz, but the deposition rate distribution thereof became degraded. Discharge was unable to take place under the pressure condition of 5 mTorr.

In the samples by the RF energy with the frequencies of 60 to 300 MHz, a drop of photosensitivity was observed in the region of from the center upper position to the center lower position of cylindrical substrate, and at positions without a drop of photosensitivity, there was a tendency of increasing the photosensitivity with decreasing pressure. The mean deposition rates were increased approximately 7 to 12 times greater than that in the case of 13.56 MHz, but the deposition rate distributions became degraded.

In the samples by the RF energy with the frequencies of 400 to 600 MHz, a drop of photosensitivity was observed at plural positions of cylindrical substrate, and at positions without a drop of photosensitivity, there was a tendency of increasing the photosensitivity with decreasing pressure. The mean deposition rates were increased approximately 4 to 6 times greater than that in the case of 13.56 MHz, but the deposition rate distributions became degraded.

Under the discharge condition of 650 MHz, discharge became discontinuous under all the pressure conditions and no film-forming sample for evaluation was able to be fabricated.

The above experimental results proved that setting of the frequency of RF energy at 30 MHz or more to cause discharge in the high vacuum region to achieve the vapor phase reaction and thus enabled obtaining excellent film characteristics, and improved the deposition rate as compared with the case of 13.56 MHz, but degraded the film quality distribution and deposition rate distribution.

TABLE 10

| Power Freq. (MHz) | Photosensitivity (film-forming pressure: 50 mTorr) | | | | | | | | | | | | | | | | | |
|---|---|---|---|---|---|---|---|---|---|---|---|---|---|---|---|---|---|---|
| | upper side (RF inlet side) | | | | | | ← Center → | | | | | | | | | lower side | | |
| 13.56 | Δ | ○ | Δ | ○ | ○ | Δ | ○ | ○ | ○ | ○ | ○ | Δ | Δ | ○ | ○ | Δ | ○ | Δ |
| 30 | ○ | Δ | X | X | Δ | ○ | ○ | Δ | Δ | ○ | Δ | ○ | Δ | ○ | ○ | Δ | ○ | Δ |
| 60 | ○ | ○ | Δ | X | X | X | Δ | ○ | ○ | ○ | ○ | ○ | ○ | ○ | ○ | ○ | ○ | ○ |
| 100 | ○ | ○ | ○ | ○ | ○ | Δ | X | X | X | X | ○ | ○ | ○ | ○ | ○ | ○ | ○ | ○ |
| 200 | ○ | ○ | ○ | ○ | ○ | ○ | ○ | ○ | X | X | X | X | Δ | ○ | ○ | ○ | ○ | ○ |
| 300 | ○ | ○ | ○ | ○ | ○ | ○ | ○ | ○ | X | X | X | X | Δ | ○ | ○ | ○ | ○ | ○ |
| 400 | Δ | Δ | X | X | Δ | Δ | Δ | Δ | Δ | Δ | Δ | X | X | X | Δ | Δ | Δ | Δ |
| 500 | Δ | Δ | Δ | X | X | X | Δ | Δ | Δ | Δ | Δ | Δ | X | X | X | Δ | Δ | Δ |
| 600 | Δ | X | Δ | Δ | Δ | X | X | X | Δ | Δ | Δ | Δ | Δ | X | X | X | Δ | Δ |
| 650* | — | — | — | — | — | — | — | — | — | — | — | — | — | — | — | — | — | — |

*Evaluation was not applicable to formation of film, because no discharge was discontinuous.

TABLE 11

| Power Freq. (MHz) | Photosensitivity (film-forming pressure: 25 mTorr) |
|---|---|
| | upper side (RF inlet side) ← Center → lower side |
| 13.56* | — — — — — — — — — — — — — — — — — |
| 30 | Δ Δ X X X Δ Δ Δ Δ Δ Δ Δ Δ Δ Δ Δ Δ |
| 60 | ○ ○ Δ X X X Δ ○ ○ ○ ○ ○ ○ ○ ○ ○ ○ |
| 100 | ○ ○ ○ ○ Δ Δ X X X X Δ ○ ○ ○ ○ ○ ○ |
| 200 | ○ ○ ○ ○ ○ ○ Δ X X X X Δ ○ ○ ○ ○ ○ |
| 300 | ○ ○ ○ ○ ○ ○ ○ ○ Δ X X X X Δ ○ ○ ○ |
| 400 | ○ ○ Δ X X Δ ○ ○ ○ ○ Δ X X X Δ ○ ○ |
| 500 | ○ ○ Δ Δ X X Δ ○ ○ ○ ○ X X X ○ ○ ○ |
| 600 | ○ X Δ ○ ○ Δ X X X Δ ○ ○ ○ X X X Δ ○ |
| 650** | — — — — — — — — — — — — — — — — — |

*Evaluation was not applicable to formation of film, because no discharge occurred.
**Evaluation was not applicable to formation of film, because discharge was discontinuous.

TABLE 12

| Power Freq. (MHz) | Photosensitivity (film-forming pressure: 25 mTorr) |
|---|---|
| | upper side (RF inlet side) ← Center → lower side |
| 13.56* | — — — — — — — — — — — — — — — — — |
| 30* | — — — — — — — — — — — — — — — — — |
| 60 | ⊙ ⊙ ○ X X X ○ ⊙ ⊙ ⊙ ⊙ ⊙ ⊙ ⊙ ⊙ ⊙ ⊙ |
| 100 | ⊙ ⊙ ○ Δ X X X X Δ ○ ⊙ ⊙ ⊙ ⊙ ⊙ ⊙ ⊙ |
| 200 | ⊙ ⊙ ⊙ ⊙ ⊙ ⊙ Δ X X X X ○ ⊙ ⊙ ⊙ ⊙ ⊙ |
| 300 | ⊙ ⊙ ⊙ ⊙ ⊙ ⊙ ⊙ ○ Δ X X X X Δ ⊙ ⊙ ⊙ |
| 400 | ○ ○ Δ X X Δ ○ ○ ○ ○ X X X Δ Δ ○ ○ |
| 500 | ○ ○ Δ Δ X X Δ ○ ○ ○ ○ X X X Δ ○ ○ |
| 600 | ○ X X ○ ○ Δ X X X Δ ○ ○ ○ X X X Δ ○ |
| 650** | — — — — — — — — — — — — — — — — — |

*Evaluation was not applicable to formation of film, because no discharge occurred.
**Evaluation was not applicable to formation of film, because discharge was discontinuous.

TABLE 13

| Power Frequency (MHz) | Mean Deposition rate (nm/s) | Distribution of Deposition Rate (%) |
|---|---|---|
| 13.56 | 0.15 | 10 |
| 30 | 0.5 | 20 |
| 60 | 1.1 | 21 |
| 100 | 1.6 | 25 |
| 200 | 1.8 | 28 |
| 300 | 1.5 | 28 |
| 400 | 0.8 | 35 |
| 500 | 0.7 | 38 |
| 600 | 0.6 | 40 |
| 650* | — | — |

Film-forming pressure: 50 mTorr
*Evaluation was not applicable to formation of film, because discharge was discontinuous.

TABLE 14

| Power Frequency (MHz) | Mean Deposition rate (nm/s) | Distribution of Deposition Rate (%) |
|---|---|---|
| 13.56* | — | — |
| 30 | 0.4 | 21 |
| 60 | 1.1 | 20 |
| 100 | 1.7 | 22 |
| 200 | 1.9 | 26 |
| 300 | 1.4 | 26 |
| 400 | 0.9 | 30 |
| 500 | 0.7 | 34 |
| 600 | 0.6 | 35 |
| 650** | — | — |

Film-forming pressure: 25 mTorr
*Evaluation was not applicable to formation of film, because no discharge occurred.
**Evaluation was not applicable to formation of film, because discharge was discontinuous.

TABLE 15

| Power Frequency (MHz) | Mean Deposition rate (nm/s) | Distribution of Deposition Rate (%) |
|---|---|---|
| 13.56* | — | — |
| 30* | — | — |
| 60 | 1.0 | 20 |
| 100 | 1.5 | 25 |
| 200 | 1.7 | 28 |
| 300 | 1.3 | 30 |

TABLE 15-continued

| Power Frequency (MHz) | Mean Deposition rate (nm/s) | Distribution of Deposition Rate (%) |
|---|---|---|
| 400 | 0.6 | 38 |
| 500 | 0.6 | 40 |
| 600 | 0.5 | 44 |
| 650** | — | — |

Film-forming pressure: 5 mTorr
*Evaluation was not applicable to formation of film, because no discharge occurred.
**Evaluation was not applicable to formation of film, because discharge was discontinuous.

COMPARATIVE EXAMPLE 2

The amorphous silicon film was formed on the flat plate substrate in the same manner as in Example 7 except that the configuration of the cathode electrode was the one wherein the cathode electrode (103) was not covered by the dielectric cover (104). The deposition rate and deposition rate distribution were evaluated for the substrate. The mean deposition rate was 6.3 nm/s and the deposition rate distribution was 35%.

COMPARATIVE EXAMPLE 3

Using the parallel plate type plasma CVD apparatus shown in FIG. 1, a glass flat plate substrate 500 mm long, 500 mm wide, and 1 mm thick was placed on the opposed electrode (705) and the amorphous silicon film was formed on the flat plate substrate under the film-forming conditions shown in Table 7, using the configuration of cathode electrode wherein the cathode electrode (103) was not covered by the dielectric cover (104). The deposition rate and deposition rate distribution were evaluated in the same procedures as in Example 7. The mean deposition rate was 3.5 nm/s and the deposition rate distribution was 85%.

As apparent from the above description, the present invention permits a high-quality deposited film of extremely uniform film thickness and film quality to be formed at a high rate on a large-area substrate of various shapes, i.e., on a cylindrical substrate, a flat plate substrate, a sheet substrate, or the like. Therefore, the present invention can realize efficient fabrication of large-area and high-quality semiconductor devices. Additionally, the present invention permits large-area deposited films, especially, excellent in electrophotographic characteristics to be stably produced in volume.

What is claimed is:

1. A plasma process apparatus comprising a reaction vessel having a space a pressure of which can be reduced, substrate holding means and a cathode electrode disposed in said reaction vessel, and a transmission line for supplying high-frequency power generated by a high-frequency power supply through a matching circuit to said cathode electrode, said plasma process apparatus generating a plasma between a substrate held by said substrate holding means and said cathode electrode to effect a plasma process on the substrate, 1) wherein an oscillation frequency of a wave oscillated from said high-frequency power supply comprises at least the range of 30 to 600 MHz,
2) wherein said matching circuit and said cathode electrode are connected through the transmission line and said high-frequency power is transmitted through said transmission line,
3) wherein said cathode electrode has an electrically conductive structure of a rod shape and wherein at a connection part between said cathode electrode and an inner conductor of said transmission line an external shape of a cross section of the cathode electrode is the same as an external shape of a cross section of the inner conductor, and
4) wherein at least the connection part between said cathode electrode and the inner conductor of said transmission line is covered by a dielectric member having the same external shape as an external shape of a transmission medium in the cross section of the transmission line.

2. The plasma process apparatus according to claim 1, wherein the substrate is a cylindrical substrate, and wherein said substrate holding means is arranged so that a plurality of such cylindrical substrates are placed around the cathode electrode disposed in the reaction vessel with center axes of the cylindrical substrates being positioned substantially on a same circumference, and so that the plasma is generated between the plurality of cylindrical substrates and said cathode electrode to effect the plasma process on surfaces of the cylindrical substrates.

3. The plasma process apparatus according to claim 1, wherein the substrate is a cylindrical substrate, and wherein said substrate holding means is arranged so that a plurality of cathode electrodes are positioned around said cylindrical substrate, and so that the plasma is generated between these cathode electrodes and cylindrical substrate to effect the plasma process on a surface of the cylindrical substrate.

4. The plasma process apparatus according to claim 1, which is constructed so that the plasma process can be effected on a surface of the substrate while rotating the substrate.

5. The plasma process apparatus according to claim 1, wherein the substrate is a flat plate substrate, and wherein a single cathode electrode or a plurality of cathode electrodes are arranged in parallel with the flat plate substrate so that the plasma is generated between the cathode electrode and the flat plate substrate to effect the plasma process on a surface of the flat plate substrate.

6. The plasma process apparatus according to claim 1, wherein the substrate is a sheet substrate fed out of a holding roll and wound up by a winding roll upon formation of film, and wherein a single cathode electrode or a plurality of cathode electrodes are arranged in parallel with the sheet substrate so that the plasma is generated between the cathode electrode and the sheet substrate to effect the plasma process on a surface of the sheet substrate.

7. The plasma process apparatus according to claim 1, wherein the oscillation frequency of the high-frequency power supply comprises at least the range of 60 to 300 MHz.

8. The plasma process apparatus according to claim 1, wherein said plasma process is a process selected from the group consisting of formation of deposit film, etching, and ashing.

9. The plasma process apparatus according to claim 1, wherein a material for said electrically conductive structure is the same as a material for said inner conductor.

10. The plasma process apparatus according to claim 1, wherein the dielectric member covering said cathode electrode and the transmission medium covering said transmission line are made of a same material.

11. The plasma process apparatus according to claim 1, wherein said transmission line has a shield for covering the transmission medium.

12. The plasma process apparatus according to claim 11, wherein said shield is grounded.

13. The plasma process apparatus according to claim 11, wherein said shield comprises an electrically conductive material.

14. A plasma process apparatus comprising a reaction vessel having a space a pressure of which can be reduced, and a cathode electrode disposed in said reaction vessel and connected through a transmission line to a high-frequency power supply an oscillation frequency of which comprises at least the range of 30 MHz to 600 MHz, wherein said cathode electrode has an electrically conductive member and wherein a shape of a cross section of a connected portion of said electrically conductive member with said transmission line is the same or substantially the same as a shape of a cross section at said connected portion, of an inner conductor of said transmission line.

15. The plasma process apparatus according to claim 14, wherein said cathode electrode has a dielectric member for covering said electrically conductive member, and wherein the dielectric member is formed in a shape which is the same or substantially the same as a contour of a cross section of a transmission medium provided around said inner conductor.

16. The plasma process apparatus according to claim 15, wherein said transmission medium is covered by an electrically conductive material.

17. A plasma process method using a plasma process apparatus comprising a reaction vessel having a space a pressure of which can be reduced, substrate holding means and a cathode electrode disposed in said reaction vessel, and a transmission line for supplying high-frequency power generated by a high-frequency power supply through a matching circuit to said cathode electrode, said plasma process apparatus generating a plasma between a substrate held by said substrate holding means and said cathode electrode to effect a plasma process on the substrate, 1) wherein an oscillation frequency of a wave oscillated from said high-frequency power supply comprises at least the range of 30 to 600 MHz, 2) wherein said matching circuit and said cathode electrode are connected through the transmission line and said high-frequency power is transmitted through said transmission line, 3) wherein said cathode electrode has an electrically conductive structure of a rod shape and wherein at a connection part between said cathode electrode and an inner conductor of said transmission line an external shape of a cross section of the cathode electrode is the same as an external shape of a cross section of the inner conductor, and 4) wherein at least the connection part between said cathode electrode and the inner conductor of said transmission line is covered by a dielectric member having the same external shape as an external shape of a transmission medium in the cross section of the transmission line, said plasma process method comprising:

reducing the pressure in said reaction vessel and introducing a gas used for the plasma process thereinto;

applying a high-frequency wave between said cathode and said substrate to generate a plasma; and effecting the plasma process on a surface of the substrate by said plasma.

18. The plasma process method according to claim 17, wherein said plasma process is formation of a deposit film.

19. The plasma process method according to claim 18, wherein said deposit film contains an amorphous substance containing at least one kind of the group IV elements.

20. The plasma process method according to claim 19, wherein the IV elements include silicon.

21. The plasma process method according to claim 17, wherein said plasma process is carried out while rotating the substrate.

22. The plasma process method according to claim 17, wherein said plasma process is carried out while moving the substrate.

23. The plasma process method according to claim 17, wherein said plasma process comprises etching or aching.

24. A plasma process apparatus comprising a reaction vessel having a space a pressure of which can be reduced, substrate holding means and a cathode electrode disposed in said reaction vessel, and a transmission line for supplying high-frequency power generated by a high-frequency power supply through a matching circuit to said cathode electrode, said plasma process apparatus generating a plasma between a substrate held by said substrate holding means and said cathode electrode to effect a plasma process on the substrate, 1) wherein an oscillation frequency of wave oscillated from said high-frequency power supply comprises at least the range of 30 to 600 MHz, 2) wherein the matching circuit and the cathode electrode are connected to each other through the transmission line; the transmission line is a coaxial transmission line formed of a columnar or cylindrical inner conductor with an outer diameter A1, a cylindrical outer conductor with a bore diameter B1 and a cylindrical dielectric member with a dielectric constant $\epsilon 1$; and the high-frequency power is transmitted through the transmission line, 3) wherein the cathode electrode is a columnar or cylindrical, conductive structure with an outer diameter A2 and is covered with a cylindrical dielectric member with a dielectric constant $\epsilon 2$ and an outer diameter B2, and 4) wherein the dimensions and dielectric constants of the members which form the transmission fins and the cathode electrode portion satisfy the relation expressed by Equation (1)

$$0.9 \times \sqrt{\frac{1}{\epsilon 1}} \times \ln\left(\frac{B1}{A1}\right) \leq \sqrt{\frac{1}{\epsilon 2}} \times \ln\left(\frac{B2}{A2}\right) \leq 1.1 \times \sqrt{\frac{1}{\epsilon 1}} \times \ln\left(\frac{B1}{A1}\right). \quad (1)$$

25. The plasma process apparatus according to claim 24, wherein the substrate is a cylindrical substrate, and wherein said substrate holding means is arranged so that a plurality of such cylindrical substrates are placed around the cathode electrode disposed in the reaction vessel with center axes of the cylindrical substrates being positioned substantially on a same circumference, and so that the plasma is generated between the plurality of cylindrical substrates and said cathode electrode to effect the plasma process on surfaces of the cylindrical substrates.

26. The plasma process apparatus according to claim 24, wherein the substrate is a cylindrical substrate, and wherein said substrate holding means is arranged so that a plurality of cathode electrodes are positioned around said cylindrical substrate, and so that the plasma is generated between these cathode electrodes and cylindrical substrate to effect the plasma process on a surface of the cylindrical substrate.

27. The plasma process apparatus according to claim 24, which is constructed so that the plasma process can be effected on a surface of the substrate while rotating the substrate.

28. The plasma process apparatus according to claim 24, wherein the substrate is a flat plate substrate, and wherein a single cathode electrode or a plurality of cathode electrodes are arranged in parallel with the flat plate substrate so that the plasma is generated between the cathode electrode and the flat plate substrate to effect the plasma process on a surface of the flat plate substrate.

29. The plasma process apparatus according to claim 24, wherein the substrate is a sheet substrate fed out of a holding roll and wound up by a winding roll upon formation of film, and wherein a single cathode electrode or a plurality of cathode electrodes are arranged in parallel with the sheet substrate so that the plasma is generated between the cathode electrode and the sheet substrate to effect the plasma process on a surface of the sheet substrate.

30. The plasma process apparatus according to claim 24, wherein the oscillation frequency of the high-frequency power supply comprises at least the range of 60 to 300 MHz.

31. The plasma process apparatus according to claim 24, wherein said plasma process is a process selected from the group consisting of formation of deposit film, etching, and ashing.

32. The plasma process apparatus according to claim 24, wherein a material for said electrically conductive structure is the same as a material for said inner conductor.

33. The plasma process apparatus according to claim 24, wherein the dielectric member covering said cathode electrode and the transmission medium covering said transmission line are made of a same material.

34. The plasma process apparatus according to claim 24, wherein said transmission line has a shield for covering the transmission medium.

35. The plasma process apparatus according to claim 34, wherein said shield is grounded.

36. The plasma process apparatus according to claim 34, wherein said shield comprises an electrically conductive material.

* * * * *

UNITED STATES PATENT AND TRADEMARK OFFICE
CERTIFICATE OF CORRECTION

PATENT NO. : 6,065,425
DATED : May 23, 2000
INVENTOR(S) : Satoshi Takaki et al.

It is certified that error appears in the above-identified patent and that said Letters Patent is hereby corrected as shown below:

Title page,
[30] FOREIGN APPLICATION PRIORITY DATA

"Jul. 23, 1997  [JP]   Japan ................9-197256" should read

-- March 25, 1996   [JP] Japan ...........8-68360
   Jul. 23 1997     [JP] Japan............9-197256 --.

Title Page [57 ABSTRACT

Line 2, "deposit" should read -- deposited --;
Line 11, "cross section" should read -- cross-section --;
Line 12, "cross section" should read -- cross-section --;
Line 17, "cross section" should read -- cross-section --;

Column 5,
Line 32, "deposit" should read -- deposited --.

Column 7,
Line 67, "cross section" should read -- cross-section --.

Column 8,
Line 7, , "cross section" should read -- cross-section --.

Column 9,
Line 28, "drawing." should read -- drawings. --.
Line 66, "After" should read -- After being --.

Column 10
Line 45, "deposit" should read -- deposited --;
Line 50, "deposit" should read -- deposited --;
Line 65, "deposit" should read -- deposited --;

Column 17,
Table 9, "photosensitive" should read -- Photoconductive --.

UNITED STATES PATENT AND TRADEMARK OFFICE
CERTIFICATE OF CORRECTION

PATENT NO. : 6,065,425
DATED : May 23, 2000
INVENTOR(S) : Satoshi Takaki et al.

It is certified that error appears in the above-identified patent and that said Letters Patent is hereby corrected as shown below:

Column 21,
Line 7, "o" should read --  --.

Column 26,
Line 3, "cross-section" should read -- cross-section --;
Line 9, "cross-section" should read -- cross-section --;

Column 27,
Line 7, "cross section" should read -- cross-section --;
Line 10, "cross section" should read -- cross-section --;
Line 17, "cross section" should read -- cross-section --;
Line 45, "cross section" should read -- cross-section --;
Line 46, "cross section" should read -- cross-section --;
Line 52, "cross section" should read -- cross-section --;

Signed and Sealed this

Second Day of October, 2001

Attest:

NICHOLAS P. GODICI
Attesting Officer    Acting Director of the United States Patent and Trademark Office